United States Patent
Abou-Khalil et al.

(10) Patent No.: US 8,482,067 B2
(45) Date of Patent: Jul. 9, 2013

(54) LATERAL EXTENDED DRAIN METAL OXIDE SEMICONDUCTOR FIELD EFFECT TRANSISTOR (LEDMOSFET) WITH TAPERED DIELECTRIC PLATES TO ACHIEVE A HIGH DRAIN-TO-BODY BREAKDOWN VOLTAGE, A METHOD OF FORMING THE TRANSISTOR AND A PROGRAM STORAGE DEVICE FOR DESIGNING THE TRANSISTOR

(75) Inventors: Michel J. Abou-Khalil, Essex Junction, VT (US); Alan B. Botula, Essex Junction, VT (US); Alvin J. Joseph, Williston, VT (US); Theodore J. Letavic, Putnam Valley, NY (US); James A. Slinkman, Montpelier, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/604,671

(22) Filed: Sep. 6, 2012

(65) Prior Publication Data
US 2013/0001589 A1 Jan. 3, 2013

Related U.S. Application Data

(62) Division of application No. 12/983,439, filed on Jan. 3, 2011, now Pat. No. 8,299,547.

(51) Int. Cl.
*H01L 29/78* (2006.01)
(52) U.S. Cl.
USPC .......................................... 257/343; 438/294
(58) Field of Classification Search
USPC .................. 257/328, 335, 343, 409, E29.256, 257/E29.261; 438/283, 294
See application file for complete search history.

(56) References Cited

U.S. PATENT DOCUMENTS 5,907,177 A 5/1999 Uda et al.
5,907,181 A 5/1999 Han et al.
(Continued)

FOREIGN PATENT DOCUMENTS
WO WO2009050669 4/2009

OTHER PUBLICATIONS

Sonsky et al., "Ultra-flexible, layout-enabled field plates for HV transistor integration in SOI-based CMOS", Proceedings of the 19th International Symposium on Power Semiconductor Devices & ICs (2007): pp. 77-80.*

(Continued)

*Primary Examiner* — Jarrett Stark
*Assistant Examiner* — Michele Fan
(74) *Attorney, Agent, or Firm* — Gibb & Riley, LLC; Richard M. Kotulak, Esq.

(57) ABSTRACT

A lateral, extended drain, metal oxide semiconductor, field effect transistor (LEDMOSFET) with a high drain-to-body breakdown voltage (Vb) incorporates gate structure extensions on opposing sides of a drain drift region. The extensions are tapered such that a distance between each extension and the drift region increases linearly from one end adjacent to the channel region to another end adjacent to the drain region. In one embodiment, these extensions can extend vertically through the isolation region that surrounds the LEDMOSFET. In another embodiment, the extensions can sit atop the isolation region. In either case, the extensions create a strong essentially uniform horizontal electric field profile within the drain drift. Also disclosed are a method for forming the LEDMOSFET with a specific Vb by defining the dimensions of the extensions and a program storage device for designing the LEDMOSFET to have a specific Vb.

20 Claims, 14 Drawing Sheets

U.S. PATENT DOCUMENTS

| | | | |
|---|---|---|---|
| 6,023,090 A | 2/2000 | Letavic et al. |
| 6,046,474 A | 4/2000 | Oh et al. |
| 6,414,365 B1 | 7/2002 | Letavic et al. |
| 6,515,336 B1 | 2/2003 | Suzawa et al. |
| 6,534,367 B2 | 3/2003 | Peake et al. |
| 6,617,656 B2 | 9/2003 | Lee et al. |
| 6,646,287 B1 | 11/2003 | Ono et al. |
| 6,717,214 B2 | 4/2004 | Pettruzello et al. |
| 6,833,726 B2 | 12/2004 | Petruzzello et al. |
| 7,663,237 B2 | 2/2010 | Peng et al. |
| 7,736,956 B2 | 6/2010 | Datta et al. |
| 7,777,278 B2 | 8/2010 | Hirler et al. |
| 7,808,050 B2 | 10/2010 | Sonsky et al. |
| 7,888,732 B2 | 2/2011 | Denison et al. |
| 7,897,478 B2 * | 3/2011 | Sonsky | 438/424 |
| 2001/0000033 A1 | 3/2001 | Baliga |
| 2004/0232486 A1 | 11/2004 | Disney et al. |
| 2006/0006386 A1 | 1/2006 | Hirler et al. |
| 2007/0120187 A1 | 5/2007 | Udrea et al. |
| 2008/0128743 A1 | 6/2008 | Letavic et al. |
| 2008/0179672 A1 | 7/2008 | Hirler et al. |
| 2008/0272428 A1 | 11/2008 | Letavic et al. |
| 2009/0072319 A1 | 3/2009 | Sonsky et al. |
| 2010/0213517 A1 | 8/2010 | Sonsky et al. |
| 2011/0127602 A1 * | 6/2011 | Mallikarjunaswamy | 257/331 |
| 2011/0147844 A1 | 6/2011 | Smith |
| 2011/0169103 A1 | 7/2011 | Darwish et al. |
| 2011/0198691 A1 * | 8/2011 | Sonsky et al. | 257/337 |

OTHER PUBLICATIONS

Heringa et al., "Innovative lateral field plates by gate fingers on STI regions in deep submicron CMOS," Proceedings of the 20th International Symposium on Power Semiconductor Devices & IC's IEEE, May 2008, pp. 271-274.

U.S. Appl. No. 12/983,439, Office Action Communication, Nov. 29, 2011, 6 pages.

U.S. Appl. No. 12/983,439, Office Action Communication, Feb. 10, 2012, 14 pages.

U.S. Appl. No. 12/983,439, Notice of Allowance Communication, Jul. 19, 2012, 9 pages.

* cited by examiner

LATERAL EXTENDED DRAIN METAL OXIDE SEMICONDUCTOR FIELD EFFECT TRANSISTOR (LEDMOSFET) WITH TAPERED DIELECTRIC PLATES TO ACHIEVE A HIGH DRAIN-TO-BODY BREAKDOWN VOLTAGE, A METHOD OF FORMING THE TRANSISTOR AND A PROGRAM STORAGE DEVICE FOR DESIGNING THE TRANSISTOR

CROSS-REFERENCE TO RELATED APPLICATIONS

This application is a divisional of U.S. Pat. No. 8,299,547, issued Oct. 30, 2012, the complete disclosure of which is incorporated herein by reference.

BACKGROUND

1. Field of the Invention

The present invention relates to a lateral, extended drain, metal oxide semiconductor, field effect transistors (LEDMOSFETs) and, more specifically, to embodiments of a LEDMOSFET having tapered dielectric plates to achieve a relatively high drain-to-body breakdown voltage, a method of forming the LEDMOSFET and a program storage device for designing the LEDMOSFET.

2. Description of the Related Art

Generally, integrated circuit structures are designed with the following goals in mind: (1) decreasing device size; (2) increasing device performance (e.g., by increasing switching speed) and (3) decreasing power consumption. Device size scaling can lead to a corresponding decrease in device channel lengths and, thereby a corresponding increase in switching speed. However, device size scaling has its limits because short channel lengths can also lead to a number of undesirable "short-channel effects". These short-channel effects include, but are not limited, a reduction in threshold voltage (Vt), an increase in drain leakage current, punch through (i.e., diffusion of dopants from the source and drain into the channel), and drain induced barrier lowering (DIBL).

To overcome or at least reduce such short-channel effects, halos can be incorporated into field effect transistor structures. Specifically, halos are highly doped regions, which have the same conductivity type as the field effect transistor body and which are positioned on each side of the channel (i.e., on the source-side and the drain-side of the channel) at the interfaces with the source and drain, respectively. These halos reduce the presence of short channel effects (e.g., increase threshold voltage (Vt), reduce punch, etc.) and the effectiveness of the halos is dependent upon the location, concentration, and confinement of the halo dopant. Unfortunately, halos with a relatively high dopant concentration can also cause a corresponding decrease in switching speed.

Consequently, field effect transistor structures have been developed that balance the need to reduce the short channel effects exhibited by a scaled device with the need for a faster switching speed. For example, one such field effect transistor structure is a lateral, extended drain, metal oxide semiconductor, field effect transistor (LEDMOSFET) that is asymmetric with respect to the source/drain drift region configuration (e.g., the drain drift region can be longer than the source drift region, if any, and can have a lower dopant concentration). Those skilled in the art will recognize that the source/drain drift regions are also often referred to source/drain extension regions. Optionally, an LEDMOSFET can also be asymmetric with respect to the halo configuration (e.g., a source-side halo only). Such an LEDMOSFET provides decreased source resistance, increased threshold voltage, decreased off current (Ioff), increased leakage at the source-to-body junction, decreased leakage at the drain-to-body junction, decreased drain-to-body capacitance and decreased drain-to-body capacitance and, thereby limits short channel effects without decreasing switching speed. Typically such transistors have a drain-to-body breakdown voltage (Vb) of 10-15 volts, making them suitable for use in many applications. However, there are applications that require transistors with higher drain-to-body breakdown voltages. For example, for switch applications, a Vb of greater than 20 volts may be required and, for micro-electronic mechanical (MEMS) applications, a Vb of 30-50 volts may be required.

SUMMARY

In view of the foregoing, disclosed herein are embodiments of a lateral, extended drain, metal oxide semiconductor, field effect transistor (LEDMOSFET) having a relatively high drain-to-body breakdown voltage (Vb). The LEDMOSFET embodiments have gate structure extensions that are positioned adjacent to opposing sides of the drain drift region and function as conductive field plates. In one embodiment, these extensions extend vertically through the isolation region that surrounds the LEDMOSFET. In another embodiment, the extensions sit atop the isolation region. In either case, each extension has a sidewall that is angled relative to the drain drift region such that the portion of the isolation region between the extension and the drain drift region (i.e., the portion of the isolation region that functions as a dielectric field plate) has a continuously increasing width along the length of the drain drift region from the channel region to the drain region. This dielectric field plate, which is tapered from the drain region to the channel region, creates a strong essentially uniform horizontal electric field profile within the drain drift. Such an electric field profile limits the transverse field to the nwell/pwell junction, limits the ionization rate to safe, low values and allows the drain drift region to be efficiently depleted so that a relatively high specific drain-to-body breakdown voltage is achieved.

Also disclosed are embodiments of an associated method for forming the LEDMOSFETs with a specific Vb and a program storage device for designing the LEDMOSFETs to have such a specific Vb.

More particularly, one embodiment of a lateral, extended drain, metal oxide semiconductor, field effect transistor (LEDMOSFET) can comprise a semiconductor body. The semiconductor body can have a top surface, a first side, and a second side opposite the first side. Additionally, this semiconductor body can comprise a channel region; a drain drift region positioned laterally adjacent to the channel region; and a drain region positioned laterally adjacent to the drain drift region opposite the channel region. The LEDMOSFET can further comprise an isolation region positioned laterally around the semiconductor body and a gate structure. The gate structure can comprise a main portion and also extensions, which function as conductive field plates.

Specifically, the main portion of the gate structure can have a horizontal section positioned adjacent to the channel region on the top surface of the semiconductor body. It can further have vertical sections positioned adjacent to the channel region on the first and second sides of the semiconductor body (i.e., extending vertically through the isolation region). Thus, in this embodiment, the LEDMOSFET is a non-planar, multi-gate, field effect transistor. The extensions can be positioned adjacent to the drain drift region on the first and second sides of the semiconductor body. Each extension can extend vertically through the isolation region and can also extend laterally from the main portion of the gate structure at the channel region towards the drain region without extending past the junction between the drain drift region and the drain region. Each extension can further have a sidewall (e.g., a linear sidewall) that is angled relative to the semiconductor body such that the portion of the isolation region between the extension and the semiconductor body has a continuously increasing width (e.g., a linearly increasing width) along the length of the drain drift region from the channel region to the drain region. In other words, the portion of the isolation region, which is between the extension and the drain drift region and which functions as a dielectric field plate, can be tapered along the length of the drain drift region from the drain region to the channel region.

Another embodiment of a lateral, extended drain, metal oxide semiconductor, field effect transistor (LEDMOSFET) can similarly comprise a semiconductor body. The semiconductor body can have a top surface, a first side, and a second side opposite the first side. Additionally, this semiconductor body can comprise a channel region; a drain drift region positioned laterally adjacent to the channel region; and a drain region positioned laterally adjacent to the drain drift region opposite the channel region. The LEDMOSFET can further comprise an isolation region positioned laterally around the semiconductor body and a gate structure. The gate structure can comprise a main portion and also extensions, which function as conductive field plates.

In this embodiment, the main portion of the gate structure can be positioned adjacent to the channel region on the top surface only of the semiconductor body. Thus, in this embodiment, the LEDMOSFET is a planar field effect transistor. The extensions can be positioned adjacent to the drain drift region on the first and second sides of the semiconductor body. Each extension can be above the isolation region (i.e., sit atop the isolation region) and can extend laterally from the main portion of the gate structure at the channel region towards the drain region without extending past the junction between the drain drift region and the drain region. Each extension can further have a sidewall (e.g., a linear sidewall) that is angled relative to the semiconductor body such that the portion of the isolation region between the extension and the semiconductor body has a continuously increasing width (e.g., a linearly increasing width) along the length of the drain drift region from the channel region to the drain region. In other words, the portion of the isolation region, which is between the extension and the drain drift region and which functions as a dielectric field plate, can be tapered along the length of the drain drift region from the drain region to the channel region.

Also disclosed is an embodiment of a method of forming a non-planar, multi-gate, LEDMOSFET, as described above. The method can comprise providing a semiconductor layer. Then, an isolation region can be formed in the semiconductor layer so as to form a semiconductor body laterally surrounded by the isolation region and having a top surface, a first side, and a second side opposite the first side. A gate structure can be formed on the semiconductor body such that the gate structure comprises a main portion and also extensions, which function as conductive field plates.

Specifically, the gate structure can be formed such that it has a main portion adjacent to a designated channel region in the semiconductor body. The main portion can have a horizontal section positioned on the top surface of the semiconductor body and vertical sections positioned on the first and second sides of the semiconductor body (i.e., extending vertically through the isolation region). The gate structure can further be formed such that it has extensions that are positioned adjacent to a designated drain drift region within the semiconductor body. This designated drain drift region can be positioned laterally between the designated channel region and a designated drain region in the semiconductor body. The extensions can be adjacent to the designated drain drift region on both the first and second sides of the semiconductor body. Each extension can extend vertically through the isolation region and can further extend laterally from the main portion of the gate structure at the channel region towards the designated drain region without extending past the junction between the designated drain drift region and the designated drain region. Additionally, each extension can further have a sidewall (e.g., a linear sidewall) that is angled relative to the semiconductor body such that the portion of the isolation region between the extension and the semiconductor body has a continuously increasing width (e.g., a linearly increasing width) along the length of the designated drain drift region from the designated channel region to the designated drain region. In other words, each extension can be formed with a sidewall that is angled such that the portion of the isolation region, which is between the extension and the designated drain drift region and which will function as a dielectric field plate, is tapered along the length of the designated drain drift region from the designated drain region to the designated channel region.

Also disclosed is an embodiment of a method of forming a planar LEDMOSFET, as described above. The method can comprise providing a semiconductor layer. Then, an isolation region can be formed in the semiconductor layer so as to form a semiconductor body laterally surrounded by the isolation region and having a top surface, a first side, and a second side opposite the first side. A gate structure can be formed on the semiconductor body such that the gate structure comprises a main portion and also extensions, which function as conductive field plates.

Specifically, the gate structure can be formed such that it has a main portion adjacent to a designated channel region on the top surface only of the semiconductor body. The gate structure can further be formed such that it has extensions positioned adjacent to a designated drain drift region within the semiconductor body. This designated drain drift region can be positioned laterally between the designated channel region and a designated drain region in the semiconductor body. The extensions can be adjacent to the designated drain drift region on both the first and second sides of the semiconductor body. Each extension can be positioned above (i.e., can sit atop) the isolation region and can extend laterally from the main portion of the gate structure at the channel region towards the designated drain region without extending past the junction between the designated drain drift region and the designated drain region. Additionally, each extension can further have a sidewall (e.g., a linear sidewall) that is angled relative to the semiconductor body such that the portion of the isolation region between the extension and the semiconductor body has a continuously increasing width (e.g., a linearly increasing width) along the length of the designated drain drift region from the designated channel region to the designated drain region. In other words, each extension can be formed with a sidewall that is angled such that the portion of the isolation region, which is between the extension and the designated drain drift region and which will function as a dielectric field plate, is tapered along the length of the designated drain drift region from the designated drain region to the designated channel region.

It should be noted that in each of the above-described method embodiment, prior to gate structure formation, the dimensions of the portion of the isolation region between each extension and the drain drift region and, thereby, the dimensions of each extension can be defined based on various specifications set forth in the design for the drain drift region (e.g., based on a specified width, a specified length, a specified height, and a specified doping profile for the drain drift region) so as to create a strong essentially uniform horizontal electric field profile within the drain drift region of the field effect transistor. Such an electric field profile limits the transverse field to the nwell/pwell junction, limits the ionization rate to a safe, low value and allows the drain drift region to be efficiently depleted. Thus, a relatively high specific drain-to-body breakdown voltage (Vb) can be achieved.

Also disclosed herein are embodiments of program storage devices associated with each of the above-described method embodiments. Specifically, the program storage devices can be readable by a computer and can tangibly embody a program of instructions executable by that computer to perform a method of designing any of the LEDMOSFETs, as described above.

BRIEF DESCRIPTION OF THE SEVERAL VIEWS OF THE DRAWINGS

The embodiments disclosed herein will be better understood from the following detailed description with reference to the drawings, which are not necessarily drawn to scale and in which.

DETAILED DESCRIPTION

Figure 1:
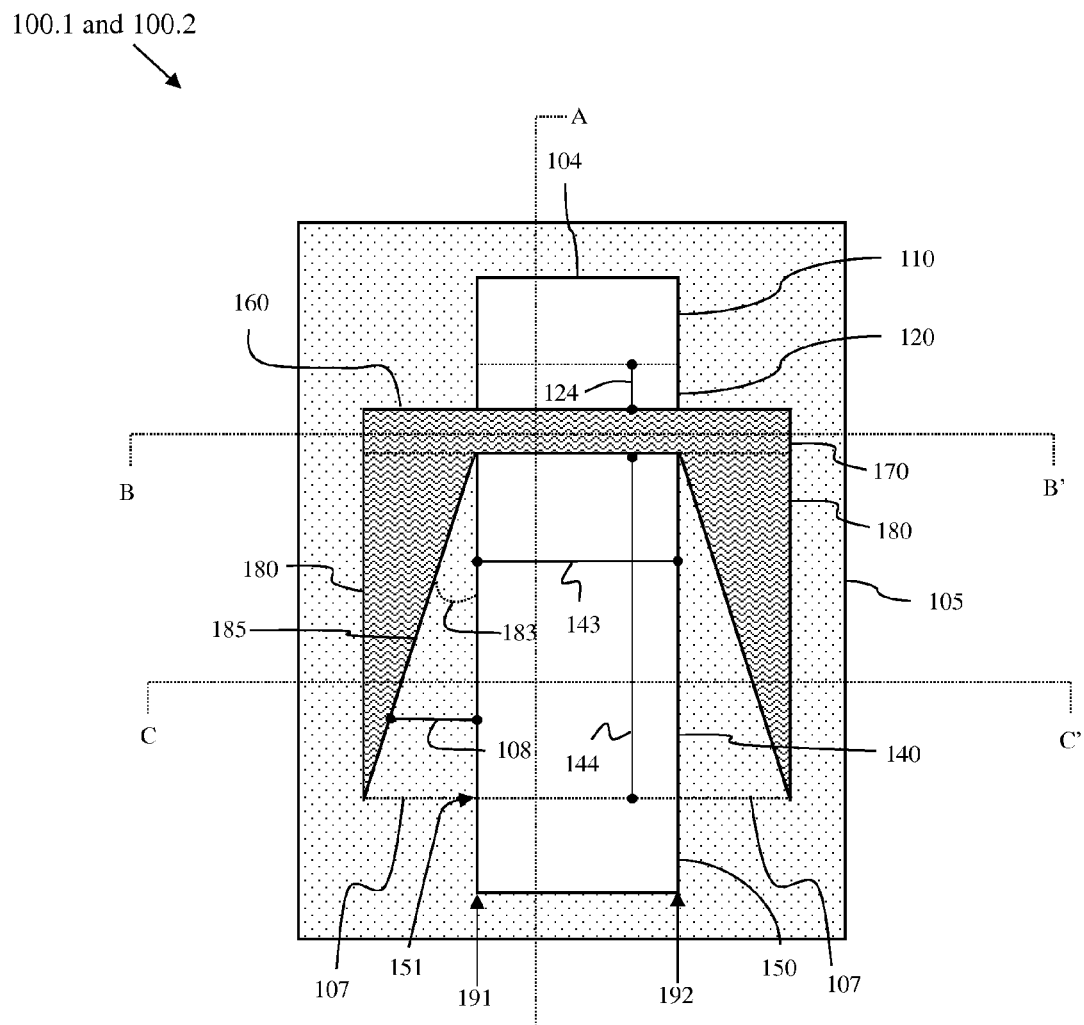
FIG. 1 is a top view illustration of multiple embodiments of an LEDMOSFET.

The embodiments of the invention and the various features and advantageous details thereof are explained more fully with reference to the non-limiting embodiments that are illustrated in the accompanying drawings and detailed in the following description.

As mentioned above, field effect transistor structures have been developed that balance the need to reduce the short channel effects exhibited by a scaled device with the need for a faster switching speed. For example, one such field effect transistor structure is a lateral, extended drain, metal oxide semiconductor, field effect transistor (LEDMOSFET) that is asymmetric with respect to the source/drain drift region configuration (e.g., the drain drift region can be longer than the source drift region, if any, and can have a lower dopant concentration). Optionally, an LEDMOSFET can also be asymmetric with respect to the halo configuration (e.g., a source-side halo only). Such an LEDMOSFET provides decreased source resistance, increased threshold voltage, decreased off current (Ioff), increased leakage at the source-to-body junction, decreased leakage at the drain-to-body junction, decreased drain-to-gate capacitance and decreased drain-to-body capacitance and, thereby limits short channel effects without decreasing switching speed. Typically such transistors have a drain-to-body breakdown voltage (Vb) of 10-15 volts, making them suitable for use in many applications. However, there are applications that require transistors with higher drain-to-body breakdown voltages. For example, for switch applications, a Vb of greater than 20 volts may be required and, for micro-electronic mechanical (MEMS) applications, a Vb of 30-50 volts may be required.

In view of the foregoing, disclosed herein are embodiments of a lateral, extended drain, metal oxide semiconductor, field effect transistor (LEDMOSFET) having a relatively high drain-to-body breakdown voltage (Vb). The LEDMOSFET embodiments have gate structure extensions that are positioned adjacent to opposing sides of the drain drift region and function as conductive field plates. In one embodiment, these extensions extend vertically through the isolation region that surrounds the LEDMOSFET. In another embodiment, the extensions sit atop the isolation region. In either case, each extension has a sidewall that is angled relative to the drain drift region such that the portion of the isolation region between the extension and the drain drift region (i.e., the portion of the isolation region that functions as a dielectric field plate) has a continuously increasing width along the length of the drain drift region from the channel region to the drain region. This dielectric field plate, which is tapered from the drain region to the channel region, creates a strong essentially uniform horizontal electric field profile within the drain drift. Such an electric field profile limits the transverse field to the nwell/pwell junction, limits the ionization rate to a safe, low values and allows the drain drift region to be efficiently depleted so that a relatively high specific drain-to-body breakdown voltage is be achieved.

Also disclosed are embodiments of an associated method for forming the LEDMOSFETs with a specific Vb and a program storage device for designing the LEDMOSFETs to have such a specific Vb.

It should be noted that in the structure and method embodiments described below the "first conductivity type" and "second conductivity type" will vary depending upon whether described LEDMOSFET is a n-type MOSFET (NFET) or p-type MOSFET (PFET). Specifically, for an NFET, the first conductivity type refers to P-type conductivity and the second conductivity type refers to N-type conductivity. However, for a PFET the reverse is true. That is, for a PFET, the first conductivity type refers to N-type conductivity and the second conductivity type refers to P-type conductivity. Those skilled in the art will recognize that the different dopants can be used to achieve different conductivity types in different semiconductor materials. For example, P-type conductivity can be achieved in silicon or polysilicon through the use of a Group III dopant, such as boron (B) or indium (In) and N-type conductivity can be achieved in silicon or polysilicon through the use of a Group V dopant, such as arsenic (As), phosphorous (P) or antimony (Sb). However, P-type conductivity can be achieved in gallium nitride (GaN) through the use of, for example, magnesium (MG) and N-type conductivity can be achieved in gallium nitride (GaN) through the use of, for example, silicon (Si).

Figure 2:
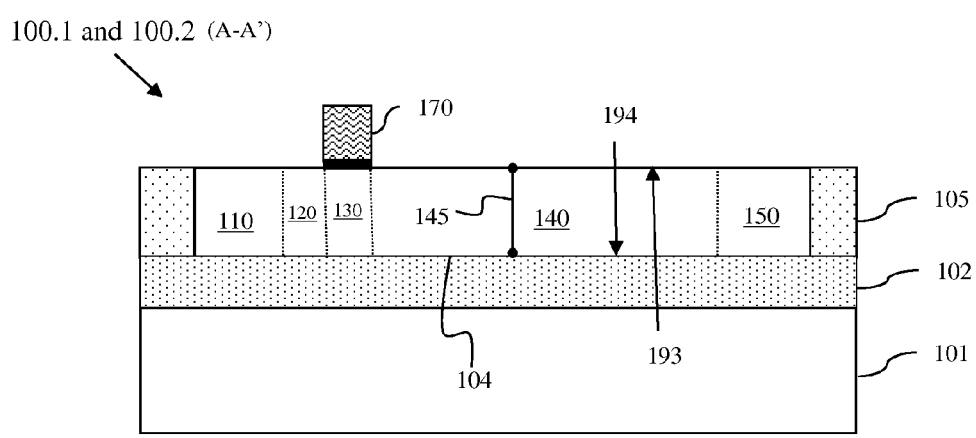
FIG. 2 is a cross-section illustration of the same multiple embodiments of the LEDMOSFET through a vertical plane A-A', as shown in FIG. 1, that cuts across the length of the LEDMOSFET.
Figure 3:
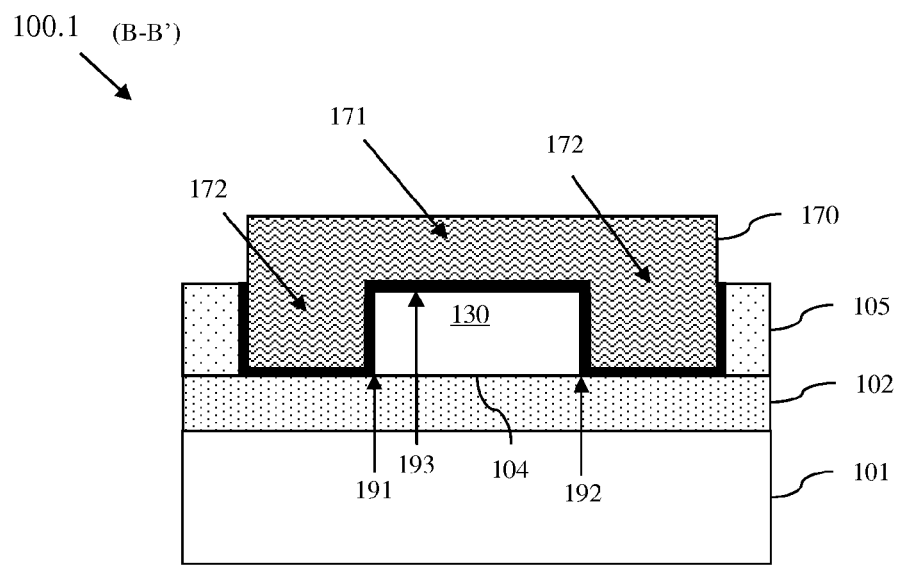
FIG. 3 is a cross-section illustration of a non-planar, multi-gate, LEDMOSFET embodiment through a vertical plane B-B', as shown in FIG. 1, that cuts across the width of a channel region of the LEDMOSFET.
Figure 4:
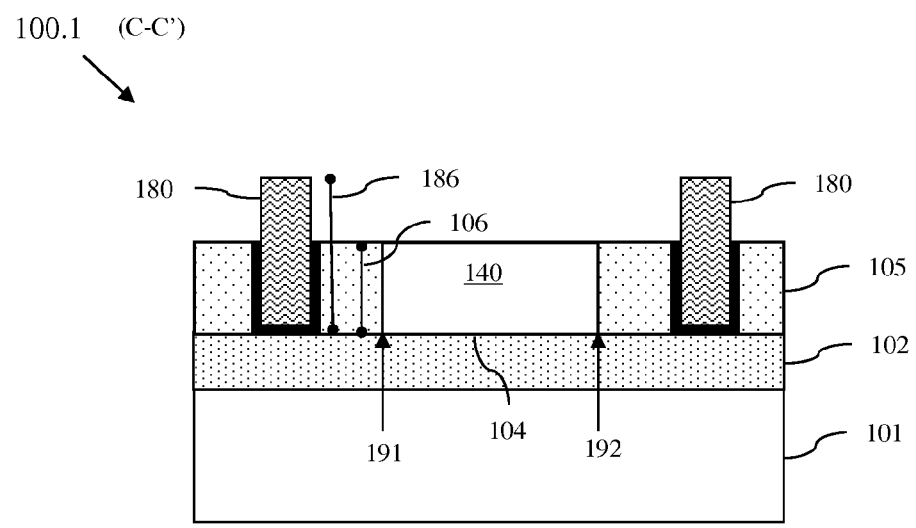
FIG. 4 is another cross-section illustration of the same non-planar, multi-gate, LEDMOSFET embodiment through a vertical plane C-C', as shown in FIG. 1, that cuts across the width of a drain drift region of the LEDMOSFET.
Figure 5:
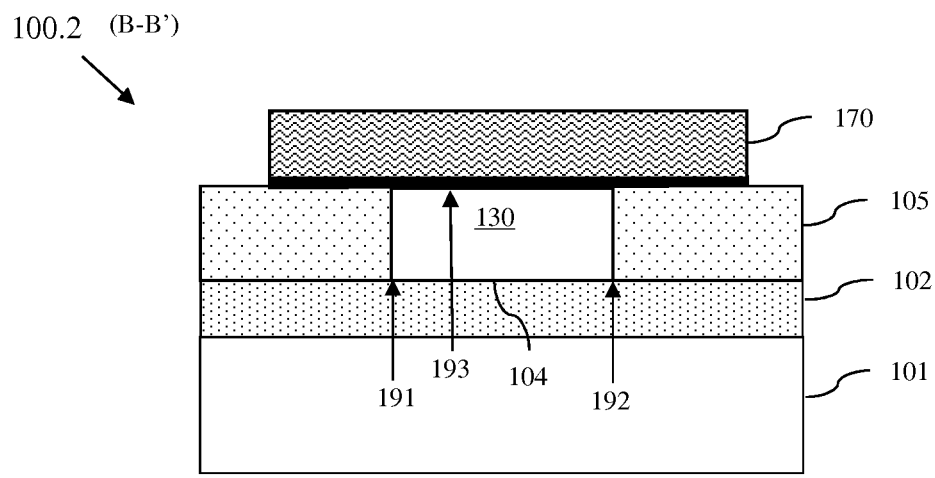
FIG. 5 is a cross-section illustration of a planar LEDMOSFET embodiment through a vertical plane B-B', as shown in FIG. 1, that cuts across the width of a channel region of the LEDMOSFET.
Figure 6:
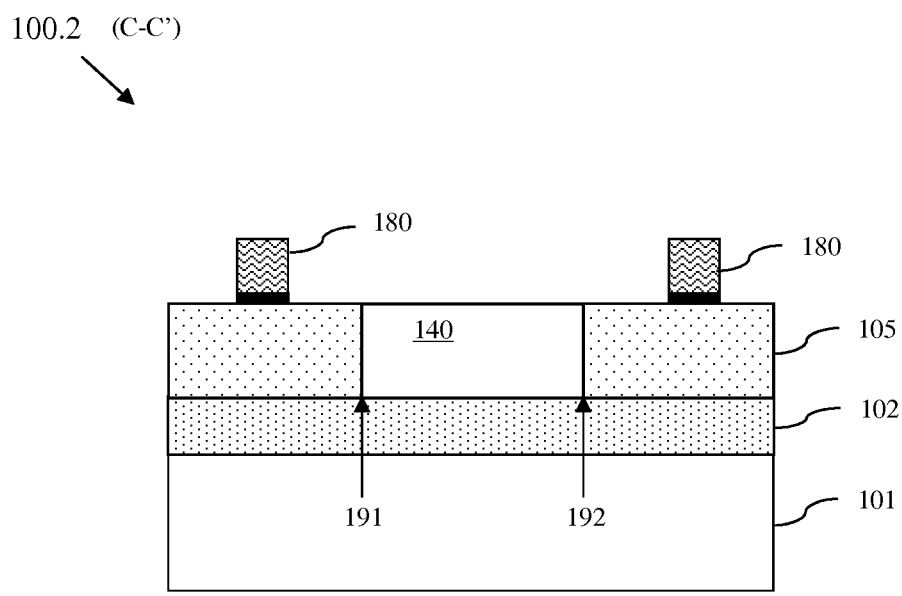
FIG. 6 is another cross-section illustration of the same planar LEDMOSFET embodiment through a vertical plane C-C', as shown in FIG. 1, that cuts across the width of a drain drift region 140 of the LEDMOSFET.

More particularly, as illustrated in FIGS. 1-6, disclosed herein are embodiments of a lateral, extended drain, metal oxide semiconductor, field effect transistor (LEDMOSFET). The first embodiment 100.1 comprises a non-planar, multi-gate LEDMOSFET, whereas the second embodiment 100.2 comprises a planar LEDMOSFET. Specifically, FIG. 1 is a top view illustration of both the embodiments 100.1 and 100.2 of the LEDMOSFET. FIG. 2 is a cross-section illustration of the embodiments 100.1 and 100.2 of the LEDMOSFET through a vertical plane that cuts across the length of the device (i.e., through the plane A-A' as shown in FIG. 1). FIG. 3 is a cross-section illustration of the embodiment 100.1 of the LEDMOSFET (i.e., the non-planar, multi-gate, LEDMOSFET) through a vertical plane that cuts across the width of the channel region 130 of the device (i.e., through the plane B-B' as shown in FIG. 1). FIG. 4 is another cross-section illustration of the embodiment 100.1 of the LEDMOSFET through a vertical plane that cuts across the width of the drain drift region 140 of the device (i.e., through the plane C-C' as shown in FIG. 1). FIG. 5 is a cross-section illustration of the embodiment 100.2 of the LEDMOSFET (i.e., the planar LEDMOSFET) through a vertical plane that cuts across the width of the channel region 130 of the device (i.e., through the plane B-B' as shown in FIG. 1). FIG. 6 is another cross-section illustration of the embodiment 100.2 of the LEDMOSFET through a vertical plane that cuts across the width of the drain drift region 140 of the device (i.e., through the plane C-C' as shown in FIG. 1).

Referring to FIGS. 1 and 2 in combination, each of these embodiments 100.1 and 100.2 can comprise a semiconductor body 104 (e.g., an essentially rectangular shaped semiconductor body). The semiconductor body 104 can have a top surface 193, a first side 191, and a second side 192 opposite the first side 191. An isolation region 105 can be positioned laterally around the semiconductor body 104.

Specifically, this semiconductor body 104 can comprise a portion of a semiconductor layer of a semiconductor-on-insulator (SOI) wafer. Such an SOI wafer can comprise a semiconductor substrate 101 (e.g., a silicon substrate or other semiconductor substrate), an insulator layer 102 (e.g., a silicon oxide layer or other suitable insulator layer) on the substrate 101 and a semiconductor layer (e.g., a single crystalline silicon layer, a single crystalline gallium nitride layer or other suitable semiconductor layer) on the insulator layer 102. The portion of the semiconductor layer that makes up the semiconductor body 104 can be defined, for example, by a trench isolation region 105. This trench isolation region 105 can, for example, comprise a conventional shallow trench isolation (STI) structure comprising a trench extending vertically through the semiconductor layer to the insulator layer 102 and filled with one or more isolation materials (e.g., a silicon oxide, silicon nitride, silicon oxynitride, etc.). Alternatively, the semiconductor body 104 of the embodiments 100.1 and 100.2 can comprise a portion, as defined by a trench isolation region 105, of a bulk semiconductor wafer (e.g., a single crystalline silicon wafer) or any other suitable wafer (e.g., a hybrid orientation (HOT) wafer) (not shown).

The semiconductor body 104 can comprise the various doped regions typically found in an LEDMOSFET in order to minimize short channel effects and still achieve a relatively fast switching speed. For example, the semiconductor body 104 can comprise a channel region 130 having a first conductivity type and source and drain regions 110, 150, having a second conductivity type, on opposite sides of the channel region 130. Optionally, a halo region 120 and/or a source drift region (not shown) can be positioned laterally between the source region 110 and the channel region 130. The halo region 120 can have the same conductivity type as the channel region 130, but can be doped at a higher concentration so as to reduce short channel effects (e.g., increase threshold voltage (Vt), reduce punch, etc.). The source drift region can have the same conductivity type as the source region 110, but can be doped at a lesser concentration. A drain drift region 140, but no a halo region, can be positioned laterally between the channel region 130 and the drain region 150. The drain drift region 140 can be relatively long such that the distance 144 between the channel region 130 and the drain region 150 is longer than the distance 124 between the channel region 130 and the source region 110. The drain drift region 140 can also have the same conductivity type as the drain region 150, but can be doped at a lesser concentration. Thus, the embodiments 100.1 and 100.2 of the LEDMOSFET can be asymmetric with respect to the source/drain extension configuration and, optionally, with respect to the halo configuration. Such an LEDMOSFET provides decreased source resistance, increased threshold voltage, decreased off current (Ioff), increased leakage at the source-to-body junction, decreased leakage at the drain-to-body junction, decreased drain-to-gate capacitance and decreased drain-to-body capacitance and, thereby limits short channel effects without decreasing switching speed.

Additionally, the embodiments 100.1 and 100.2 of the LEDMOSFET can incorporate conductive field plates 180 separated from the drain drift region 140 by tapered dielectric plates 107, as discussed in greater detail below, to increase the drain-to-body breakdown voltage (Vb) (e.g., up to or over 40 volts) so that the LEDMOSFET is suitable for high voltage applications (e.g., switch or micro-electronic mechanical (MEMS) applications). Specifically, the embodiments 100.1 and 100.2 of the LEDMOSFET can comprise a gate structure 160. The gate structure 160 can comprise a gate dielectric layer (e.g., a gate oxide layer, a high-k gate dielectric layer or other suitable gate dielectric layer) and a gate conductor layer (e.g., a polysilicon gate conductor layer, a metal gate conductor layer, a dual work function gate conductor layer or other suitable gate conductor layer) on the gate dielectric layer. The gate structure 160 can further comprise a main portion 170 adjacent to the channel region 130 and symmetric extensions 180, which are adjacent to the drain drift region 140 and which function as conductive field plates. Each extension can each have a sidewall 185 (e.g., a linear sidewall) that is angled relative to the semiconductor body 104 such that the portion 107 of the isolation region 105 between the extension 180 and the semiconductor body 104 has a continuously increasing width 108 (e.g., a linearly increasing width) along the length 144 of the drain drift region 140 from the channel region 130 to the drain region 150. In other words, the portion of the isolation region 107, which is between the extension 180 and the drain drift region 140 and which functions as a dielectric field plate, can be tapered along the length 144 of the drain drift region 140 from the drain region 150 to the channel region 130.

The embodiments 100.1 and 100.2 vary depending upon whether the gate structure 160, including the main portion 170 and extensions 180, extends vertically through the isolation region 105 such the LEDMOSFET is a non-planar, multi-gate, LEDMOSFET or whether the gate structure 160 is positioned only above the level of the isolation region 105 such that the LEDMOSFET is a planar LEDMOSFET, respectively.

Specifically, referring to FIGS. 3-4 in combination with FIGS. 1-2, in a non-planar, multi-gate, LEDMOSFET 100.1, the main portion 170 of the gate structure 160 can have a horizontal section 171 positioned adjacent to (i.e., traversing) the channel region 130 on the top surface 193 of the semiconductor body 104 and vertical sections 172 positioned adjacent to the channel region 130 on the first and second sides 191-192 of the semiconductor body 104 (i.e., extending vertically through the isolation region 105, for example, to the insulator layer 102 in the case of an SOI wafer) (see FIG. 3). Thus, in this embodiment 100.1, the LEDMOSFET is a non-planar, multi-gate, field effect transistor. Additionally, in this embodiment, the extensions 180, which function as conductive field plates, can be positioned adjacent to the drain drift region 140 on the first and second sides 191-192 of the semiconductor body. Each extension 180 can extend vertically through the isolation region 105 (e.g., to the insulator layer 102 in the case of an SOI wafer) and can have a first height 186 (e.g., as measured from the top of the insulator layer 102) that is greater than a second height 106 (e.g., also as measured from the top of the insulator layer 102) of the isolation region 105 (see FIG. 4). Each extension 180 can further extend laterally from the main portion 170 of the gate structure 160 at the channel region towards the drain region 150 without extending past the junction between the drain drift region 140 and the drain region 150 (see FIG. 1).

As mentioned above, each extension 180 can each have a sidewall 185 (e.g., a linear sidewall) that is angled (e.g., see angle 183) relative to the semiconductor body 104 such that the portion 107 of the isolation region 105 between the extension 180 and the semiconductor body 104 has a continuously increasing width 108 (e.g., a linearly increasing width) along the length 144 of the drain drift region 140 from the channel region 130 to the drain region 150. In other words, the portion 107 of the isolation region 105, which is between the extension 180 and the drain drift region 140 and which functions as a dielectric field plate, can be tapered along the length 144 of the drain drift region 140 from the drain region 150 to the channel region 130. Such tapered dielectric field plates create a strong uniform horizontal electric field profile within the drain drift region 140 of the semiconductor body 104 (i.e., from the channel region 130 to the drain region 150). This strong uniform electric field profile limits the transverse field to the nwell/pwell junction, limits the ionization rate to a safe, low values and allows the drain drift region to be efficiently depleted so that a relatively high drain-to-body breakdown voltage (e.g., Vb=15-50 volts) can be achieved.

It should be noted that the dimensions of each portion 107 of the isolation region 105 between each extension 180 and the drain drift region 140 (i.e., the dimensions of the tapered dielectric field plates) including, but not limited to, the length and maximum width and, thereby, the dimensions of each extension 180 (i.e., the dimensions of the conductive field plates) including, but not limited to, the angle 183 at which the sidewall 185 is positioned relative to the semiconductor body 104 and the length of the sidewall 185 are predefined based on the dimensions and doping profile of the drain drift region 140 so that the LEDMOSFET 100.1 has a specific drain-to-body breakdown voltage (Vb) (see detailed discussion below with regard to the method embodiments).

Alternatively, referring to FIGS. 5-6 in combination with FIGS. 1-2, in a planar LEDMOSFET 100.2, the main portion 170 of the gate structure 160 can be positioned adjacent to (i.e., traversing) the channel region 130 on the top surface 193 only of the semiconductor body 104 (see FIG. 5). Thus, in this embodiment, the LEDMOSFET 100.2 is a planar field effect transistor. The extensions 180, which function as conductive field plates, can be positioned adjacent to the drain drift region 140 on the first and second sides 191-192 of the semiconductor body 104. Each extension 180 can be above the isolation region 105 (i.e., sit atop the isolation region 105 and not extend vertically through the isolation region 105) (see FIG. 6). Each extension 180 can further extend laterally from the main portion 170 of the gate structure 160 at the channel region towards the drain region 150 without extending past the junction 151 between the drain drift region 140 and the drain region 150 (see FIG. 1).

As with the previously described embodiment, each extension 180 can each have a sidewall 185 (e.g., a linear sidewall) that is angled (e.g., see angle 183) relative to the semiconductor body 104 such that the portion 107 of the isolation region 105 between the extension 180 and the semiconductor body 104 has a continuously increasing width 108 (e.g., a linearly increasing width) along the length 144 of the drain drift region 140 from the channel region 130 to the drain region 150. In other words, the portion 107 of the isolation region 105, which is between the extension 180 and the drain drift region 140 and which functions as a dielectric field plate, can be tapered along the length 144 of the drain drift region 140 from the drain region 150 to the channel region 130. Such tapered dielectric field plates similarly create a strong essentially uniform horizontal electric field profile within the drain drift region 140 of the semiconductor body 104 (i.e., from the channel region 130 to the drain region 150). This strong essentially uniform electric field profile limits the transverse field to the nwell/pwell junction, limits the ionization rate to safe, low values and allows the drain drift region to be efficiently depleted so that a relatively high drain-to-body breakdown voltage (e.g., Vb=15-30 volts) can be achieved. While this embodiment may not allow for a horizontal electric field profile that is as strong as that in the previously described embodiment may and, thus, may not allow for as high of an increase in the Vb it still allows for a higher Vb than seen in the prior art.

Again, it should be noted that the dimensions of each portion 107 of the isolation region 105 between each extension 180 and the drain drift region 140 (i.e., the dimensions of the tapered dielectric field plates) including, but not limited to, the length and maximum width and, thereby, the dimensions of each extension 180 (i.e., the dimensions of the conductive field plates) including, but not limited to, the angle 183 at which the sidewall 185 is positioned relative to the semiconductor body 104 and the length of the sidewall 185 are predefined based on the dimensions and doping profile of the drain drift region 140 so that the LEDMOSFET 100.2 has a specific drain-to-body breakdown voltage (Vb) (see detailed discussion below with regard to the method embodiments).

Those skilled in the art will recognize that, like other non-planar, multi-gate FETs, the effective channel width and, thereby the drive current, of the first embodiment 100.1 described above can be increased by incorporating multiple fingers (i.e., fins) into the structure as opposed to a single semiconductor body. Therefore, referring to FIGS. 7-10, also disclosed is an embodiment of a multi-finger (i.e., multi-fin) LEDMOSFET 200. Specifically, referring to FIGS. 7 and 8 in combination, the LEDMOSFET 200 can comprise a semiconductor body 204. This semiconductor body 204 can comprise multiple semiconductor fingers (i.e., semiconductor fins) 214a-c extending laterally between and perpendicular to two shared semiconductor end regions 215, 255. Each semiconductor finger (i.e., each fin) 214a-c can have a top surface 293, a first side 291, and a second side 292 opposite the first side 291. An isolation region 205 can be positioned laterally around the semiconductor body 204 and also between each finger 214a-c. As in the embodiments 100.1 and 100.2 described above, this semiconductor body 204 can comprise a portion of a semiconductor layer of a semiconductor-on-insulator (SOI) wafer, as defined, for example, by a trench isolation region 205. Alternatively, the semiconductor body 204 can comprise a portion, as defined by an isolation region 205, of a bulk semiconductor wafer (e.g., a single crystalline silicon wafer) or any other suitable wafer (e.g., a hybrid orientation (HOT) wafer) (not shown).

The semiconductor body 204 can further comprise the various doped regions typically found in a multi-finger (i.e., multi-fin) LEDMOSFET to minimize short channel effects and still achieve a relatively fast switching speed. For example, each semiconductor finger (i.e., each semiconductor fin) 214a-c can comprise a channel region 230a-c having a first conductivity type and the end regions 215, 255 can comprise source and drain regions 210, 250, having a second conductivity type. Optionally, a halo region can be positioned laterally between the source region 210 and each channel region 230a-c, for example, either within each finger (as shown, see halo regions 230a-c) or within the end region 215. The halo region(s) can have the same conductivity type as the channel regions 230a-c, but can be doped at a higher concentration so as to reduce short channel effects (e.g., increase threshold voltage (Vt), reduce punch, etc.). A drain drift region 240a-c, but no halo region can be positioned within each finger 214a-c between corresponding channel region 230a-c and the drain region 250. Each drain drift region 240a-c can be relatively long such that the distance between the channel region 230a-c and the drain region 250 is longer than the distance between the channel region 230a-c and the source region 250. The drain drift regions 240a-c can have the same conductivity type as the drain region 250, but can be doped at a lesser concentration. Thus, the LEDMOSFET 200 can be asymmetric with respect to the source/drain extension configuration and, optionally, with respect to the halo configuration.

Additionally, the LEDMOSFET 200 can incorporate conductive field plates 280a-c separated from the drain drift regions 240a-c within each finger 214a-c by tapered dielectric plates 207a-c to increase the drain-to-body breakdown voltage (Vb) (e.g., up to or over 40 volts) so that the LEDMOSFET is suitable for high voltage applications (e.g., switch or micro-electronic mechanical (MEMS) applications). Specifically, the LEDMOSFET 200 can comprise a gate structure 260. The gate structure 260 can comprise a gate dielectric layer and a gate conductor layer on the gate dielectric layer. The gate structure 260 can further comprise a main portion 270 adjacent to the channel regions 230a-c and also extensions 280a-c, which are adjacent to the drain drift regions 240a-c and which function as conductive field plates.

Figure 7:
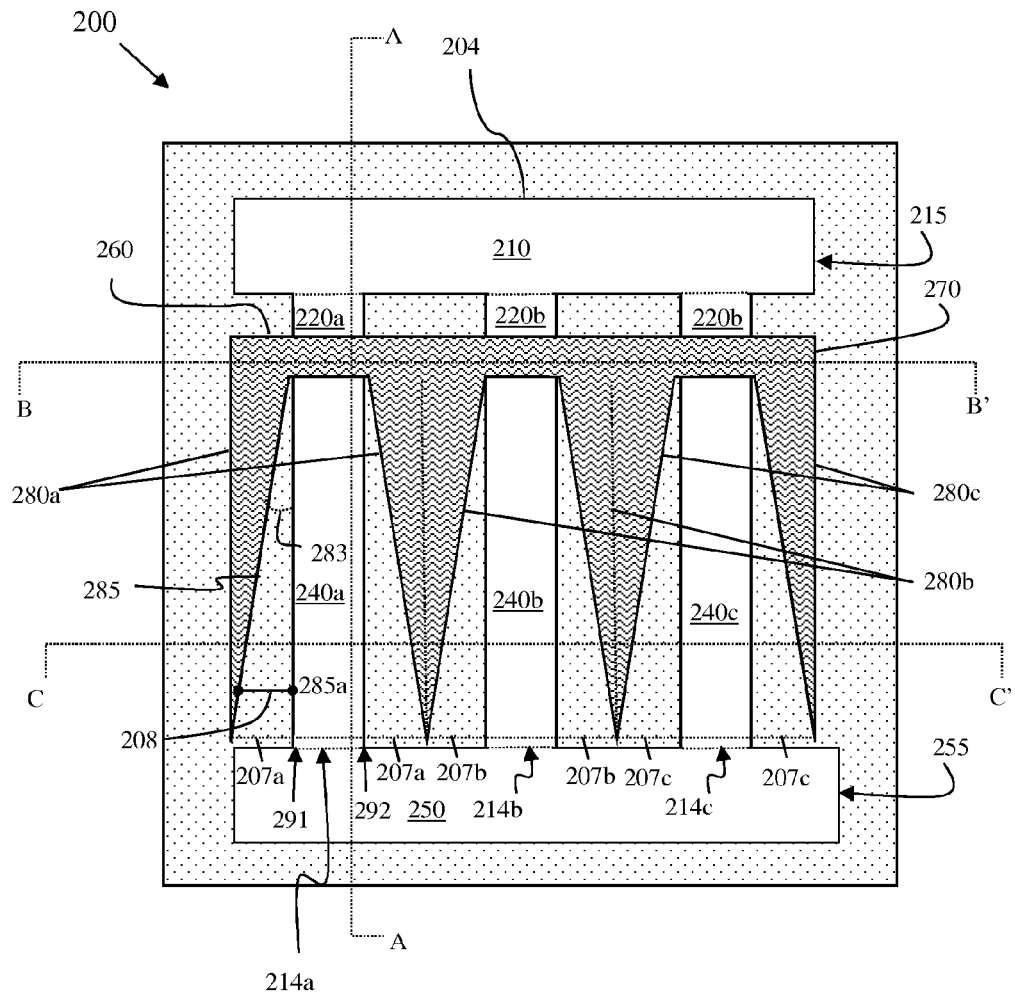
FIG. 7 is a top view illustration of an embodiment of a multi-finger LEDMOSFET.
Figure 8:
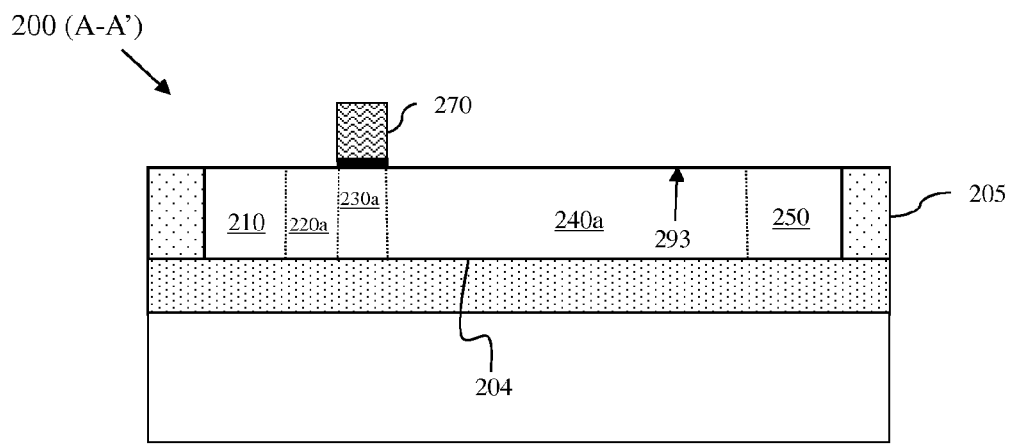
FIG. 8 is a cross-section illustration of the same multi-finger LEDMOSFET through a vertical plane A-A', as shown in FIG. 7, that cuts across the length of a single finger of the LEDMOSFET.
Figure 9:
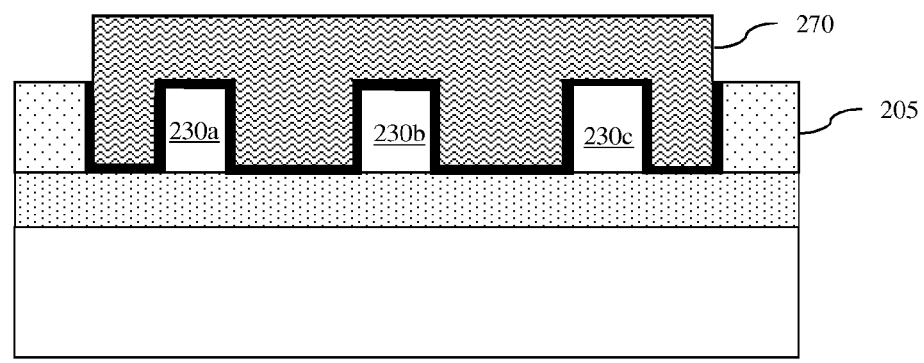
FIG. 9 is a cross-section illustration of the same multi-finger LEDMOSFET through a vertical plane B-B', as shown in FIG. 7, that cuts across the width of the channel regions within each finger of the LEDMOSFET.
Figure 10:
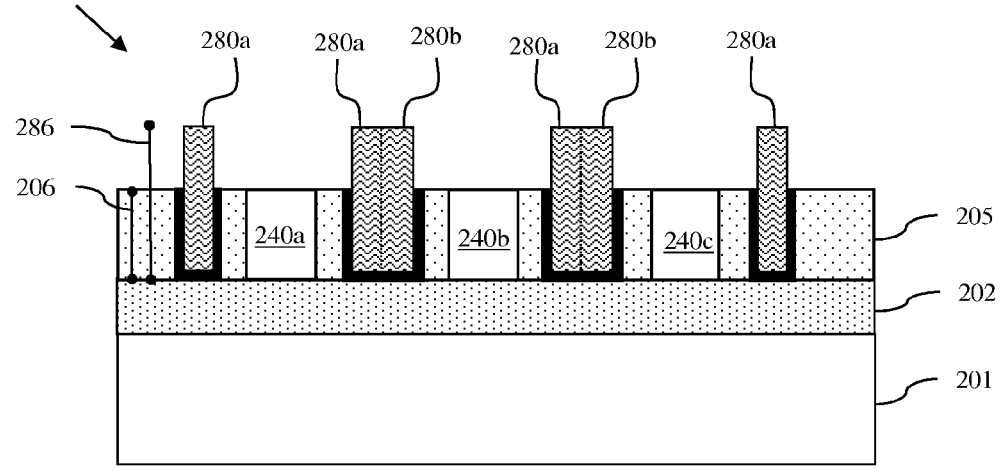
FIG. 10 is another cross-section illustration of the same multi-finger LEDMOSFET through a vertical plane C-C', as shown in FIG. 7, that cuts across the width of the drain drift regions within each finger of the LEDMOSFET.

Referring to FIGS. 9-10 in combination with FIGS. 7-8, the main portion 270 of the gate structure 260 can have a horizontal section positioned adjacent to (i.e., traversing) the channel regions 230a-c on the top surface 293 of the semiconductor body 204 and vertical sections positioned adjacent to the channel regions 230a-c on the first and second sides 291-292 of each semiconductor finger 214a-c (i.e., extending vertically through the isolation region 205, for example, to the insulator layer in the case of an SOI wafer) (see FIG. 7). The extensions 280a-c can be positioned adjacent to each drain drift region 240a-c on the first and second sides 291-292 of each semiconductor finger 214a-c. Each extension can extend vertically through the isolation region 205 (e.g., to the insulator layer in the case of an SOI wafer) and can have a first height 286 (e.g., as measured from the top of the insulator layer) that is greater than a second height 206 (e.g., also as measured from the top of the insulator layer) of the isolation region 205 (see FIG. 10). Each extension can further extend laterally from the main portion 270 of the gate structure 260 at the channel regions towards the drain region 250 without extending past the junctions between the drain drift regions 240a-c and the drain region 250 (see FIG. 7).

Additionally, each extension 280a-c can have a sidewall 285 (e.g., a linear sidewall) that is angled (e.g., see angle 283) relative to a corresponding semiconductor finger 214a-c so that each portion 207a-c of the isolation region 205 that is between an extension 280a-c and a semiconductor finger 214a-c has a continuously increasing width 208 (e.g., a linearly increasing width) along the length of the drain drift region within the finger 214a-c from the channel region 230a-c to the drain region 250. In other words, each portion 207a-c of the isolation region 205, which is between an extension 280a-c and a drain drift region 240a-c and which functions as a dielectric field plate, can be tapered along the length of that drain drift region 240a-c from the drain region 250 to the channel region 230a-c. Such tapered dielectric field plates create a strong essentially uniform horizontal electric field profile within the drain drift regions 240a-c of the semiconductor fingers 214a-c (i.e., from the channel regions 230a-c to the drain region 250). This strong essentially uniform electric field profile limits the transverse field to the nwell/pwell junction, limits the ionization rate to safe, low values and allows the drain drift regions to be efficiently depleted so that a relatively high drain-to-body breakdown voltage (e.g., Vb=15-50 volts) can be achieved. It should be noted that the dimensions of each portion 207a-c of the isolation region 205 between each extension 280a-c and a drain drift region 240a-c (i.e., the dimensions of the tapered dielectric field plates) including, but not limited to, the length and maximum width and, thereby, the dimensions of each extension 280a-c (i.e., the dimensions of the conductive field plates) including, but not limited to, the angle 283 at which each sidewall 285 is positioned relative to a corresponding semiconductor finger 214a-c and the length of each linear sidewall 285 are pre-defined based on the dimensions and doping profile of the drain drift regions 240a-c so that the LEDMOSFET 200 has a specific drain-to-body breakdown voltage (Vb) (see detailed discussion below with regard to the method embodiments).

It should be noted that in any of the above-described LEDMOSFET structures 100.1, 100.2 and 200, the body of the LEDMOSFET can be either floating (i.e., non-contacted) or contacted. Various body contact structures for MOSFETs are well-known in the art. Thus, the details of such body contact structures are omitted from this specification in order to allow the reader to focus on the salient aspects of the invention.

Figure 11:
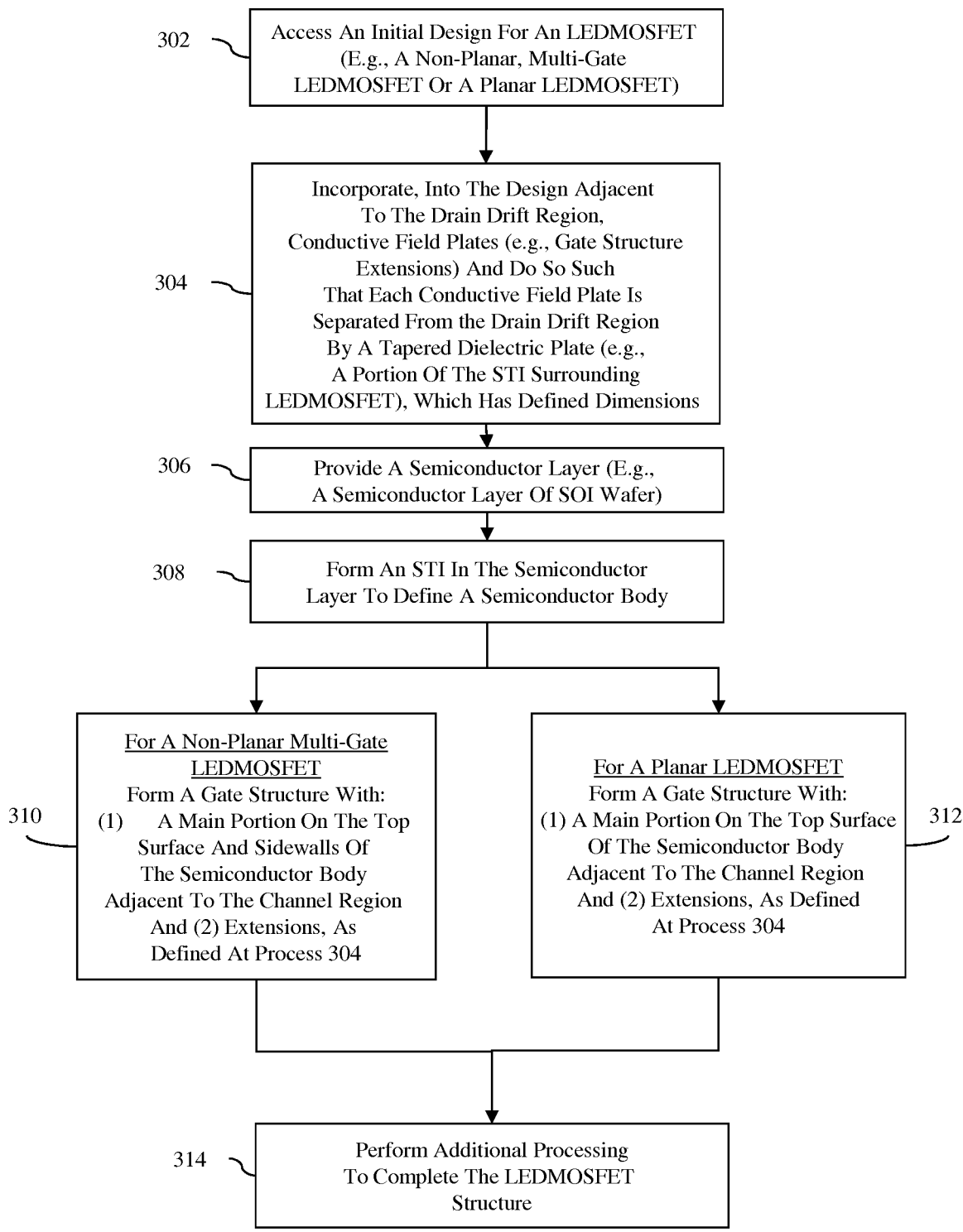
FIG. 11 is a flow diagram illustrating method embodiments for forming the LEDMOSFETs of the present invention.

Referring to the flow diagram of FIG. 11, also disclosed herein are method embodiments for forming both the non-planar, multi-gate, LEDMOSFET 100.1, as described above and illustrated in FIGS. 1-4, and the planar LEDMOSFET 100.2, as described above and illustrated in FIGS. 1-2 and 5-6. The method embodiments can comprise accessing an initial design for an LEDMOSFET (302). The initial design can, for example, be stored in a data storage device of a computer system and can comprise a high-level description, which sets out the requirements and specifications for the LEDMOSFET in a hardware description language (HDL) (e.g., VHDL or Verilog).

Next, the method embodiments can comprise incorporating, into the design, conductive field plates 180 adjacent to a drain drift region and, doing so, such that each gate extension 180 (i.e., each conductive field plate) will be separated from that drain drift region 140 by a tapered dielectric plate 107, which has defined dimensions, in order to increase the drain-to-body breakdown voltage (Vb) of the LEDMOSFET to a specific level (e.g., 15, volts, 20 volts, 30 volts, 40 volts, 50 volts etc.) (304). As shown in FIG. 1, these conductive field plates 180 can comprise extensions of the LEDMOSFET gate structure and the tapered dielectric plates 107 can comprise defined portions of the isolation region 105 which surrounds the LEDMOSFET.

In one embodiment, the design that is accessed at process 302 can be for a non-planar, multi-gate, LEDMOSFET. Referring to FIGS. 1-4, this non-planar, multi-gate, LEDMOSFET design can comprise a semiconductor body 104 having a top surface 193, a first side 191, and a second side 192 opposite the first side 191. The semiconductor body 104 can comprise at least a channel region 130, drain drift region 140 positioned laterally adjacent to the channel region 130, and a drain region 150 positioned laterally adjacent to the drain drift region 140 opposite the channel region 130. This non-planar, multi-gate, LEDMOSFET design can further comprise an isolation region 105 positioned laterally around the semiconductor body 104 and a gate structure 170 adjacent to the channel region 130 on the top surface 193 and on the first side 191 and the second side 192 of the semiconductor body 104, extending vertically through the isolation region 105 (e.g., to an insulator layer 102).

Gate structure extensions 180, as shown in FIGS. 1 and 4, can be incorporated into this design at process 304 such that each extension 180 extends vertically through the isolation region 105 (e.g., to an insulator layer 102) and such that each extension 180 further extends laterally from the gate structure 170 toward the drain region 150. Each extension 180 can further have a sidewall 185 (e.g., a linear sidewall) that is angled (e.g., see angle 183) relative to the semiconductor body 104 such that a portion 107 of the isolation region 105 between the extension 180 and the semiconductor body 104 will have a continuously increasing width 108 (e.g., a linearly increasing width) along the length 144 of the drain drift region 140 from the channel region 130 to the drain region 150. In other words, by design the portion 107 of the isolation region 105, which will be between the extension 180 and the drain drift region 140 and which will function as a dielectric field plate, will be tapered along the length 144 of the drain drift region 140 from the drain region 150 to the channel region 130.

In another embodiment, the design that is accessed at process 302 can be for a planar LEDMOSFET. Referring to FIGS. 1-2 and 5-6, this planar LEDMOSFET design can similarly comprise a semiconductor body 104 having a top surface 193, a first side 191, and a second side 192 opposite the first side 191. The semiconductor body 104 can comprise at least a channel region 130, drain drift region 140 positioned laterally adjacent to the channel region 130, and a drain region 150 positioned laterally adjacent to the drain drift region 140 opposite the channel region 130. This planar LEDMOSFET design can further comprise an isolation region 105 positioned laterally around the semiconductor body 104 and a gate structure 170 adjacent to the channel region 130 on the top surface 193 only of the semiconductor body 104.

Gate structure extensions 180, as shown in FIGS. 1 and 6, can be incorporated into this design at process 304 such that each extension 180 is above the isolation region 105 (i.e., sits atop the isolation region 105 and does not extend vertically through the isolation region 105) and further such that each extension 180 extends laterally from the gate structure 170 toward the drain region 150. Each extension 180 can further have a sidewall 185 (e.g., a linear sidewall) that is angled (e.g., see angle 183) relative to the semiconductor body 104 such that a portion 107 of the isolation region 105 between the extension 180 and the semiconductor body 104 will have a continuously increasing width 108 (e.g., a linearly increasing width) along the length 144 of the drain drift region 140 from the channel region 130 to the drain region 150. In other words, by design the portion 107 of the isolation region 105, which will be between the extension 180 and the drain drift region 140 and which will function as a dielectric field plate, will be tapered along the length 144 of the drain drift region 140 from the drain region 150 to the channel region 130.

In either case, the process 304 of incorporating such extensions 180 into the design can comprise defining (i.e., predetermining) the dimensions of each portion 107 of the isolation region 105 (i.e., each tapered dielectric plate) that will be between an extension 180 (i.e., a conductive field plate) and the semiconductor body 104, including, but not limited to, defining the length and maximum width of that portion 107 and, thereby, defining the dimensions of each extension 180 including, but not limited to, defining the angle 183 at which the sidewall 185 of each extension 180 will be positioned relative to the semiconductor body 104 and the length of the sidewall 185. The dimensions can specifically be defined (i.e., determined, calculated, etc.) based on the specifications set out in the design for the drain drift region 140 in order to form a field effect transistor 100.1 or 100.2 that will have an essentially uniform horizontal electric field profile within the drain drift region 140 and a specific drain-to-body breakdown voltage (Vb). These specifications can include, but are not limited to, the specified width 143 for the drain drift region 140 from the first side 191 to the second side 192 of the semiconductor body 104, the specified length 144 of the drain drift region 140 from the channel region 130 to the drain region 150, the specified height 145 for the drain drift region 140 (e.g., as measured from the top surface an insulator layer below, in the case an SOI device) and the specified doping profile for the drain drift region 140

It should be noted that, while the planar LEDMOSFET embodiment 100.2 may not allow for a horizontal electric field profile that is as strong as that in non-planar, multi-gate, LEDMOSFET embodiment 100.2 and, thus, may not allow for as high of an increase in the Vb it still allows for a higher Vb than that seen in the prior art. That is, for example, in the LEDMOSFET embodiment 100.1 a Vb ranging between 15 volts and 50 volts can be achieved and in the LEDMOSFET embodiment 100.2 a Vb ranging between 15 volts and 30 volts can be achieved. In either case, this is over the Vb of 10-15 volts typically seen in conventional LEDMOSFETs.

More specifically, the following formula can be used to calculate the optimal dimensions for the tapered dielectric field plates 107 and conductive field plates 180. The variation of the tapered dielectric thickness can be found as a function of the lateral field variation Ex. Specifically, the tapered dielectric thickness tdielectric (x) is given as: tdielectric (x)=Ex ∈0 ∈dielectric*x/(q Nd tsemi)+C, where Ex is the lateral electrical field, Ld is the length of the drift region, Nd is the doping level in the drift region, tsemi is the half-width of the semiconductor body and C is a constant. Such formulas describe the variation of the lateral and vertical electrical field in both the SOI silicon body and the tapered dielectric. Solving these formulas for a constant lateral field provides the needed tox for given values of BVds, tsoi, Ld, and Nd.

Figure 12:
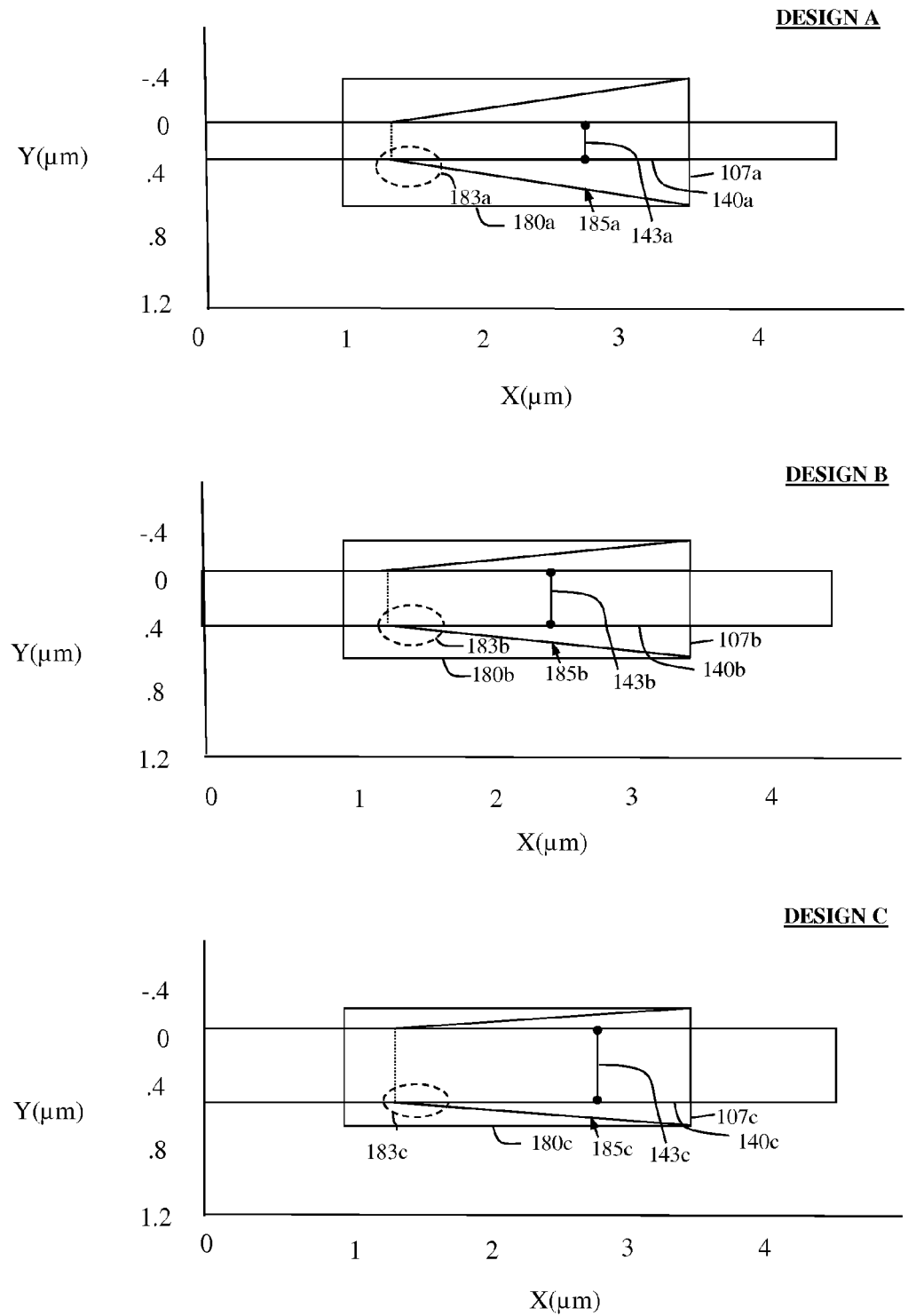
FIG. 12 is a diagram illustrating process step 304 of the flow diagram of FIG. 11.

Thus, it should be understood that the dimensions of the tapered dielectric field plates 107 and conductive field plates 180 in either the non-planar, multi-gate, LEDMOSFET 100.1 or the planar LEDMOSFET 100.2 will vary depending upon the various specifications for the drain drift region 140 and the desired Vb. For example, as illustrated in FIG. 12, if three designs A, B and C vary only with respect to the specified width for the drain drift region, then the maximum width of the tapered dielectric plate and, thereby, the angle of the conductive field plate sidewall relative to the drain drift region can be varied in order to achieve the same Vb. That is, Design A, which has the narrowest drain drift region width 143a, will require a tapered dielectric field plate 107a with the greatest maximum width and, thereby, a conductive field plate 180a with a sidewall 185a at the greatest angle 183a relative to the drain drift region 140a. Design B, which has the next narrowest drain drift region width 143b, will require a tapered dielectric field plate 107b with the next greatest maximum width and, thereby, a conductive field plate 180b with a sidewall 185b at the next greatest angle 183b relative to the drain drift region 140b. Finally, design C, which has the widest drain drift region width 143c, will require a tapered dielectric field plate 107c with the narrowest maximum width and, thereby, a conductive field plate 180c with a sidewall 185c at the smallest angle 183c relative to the drain drift region 140c. Once the dimensions are defined at process 304, the LEDMOSFET 100.1 or 100.2 can be formed.

Figure 13:
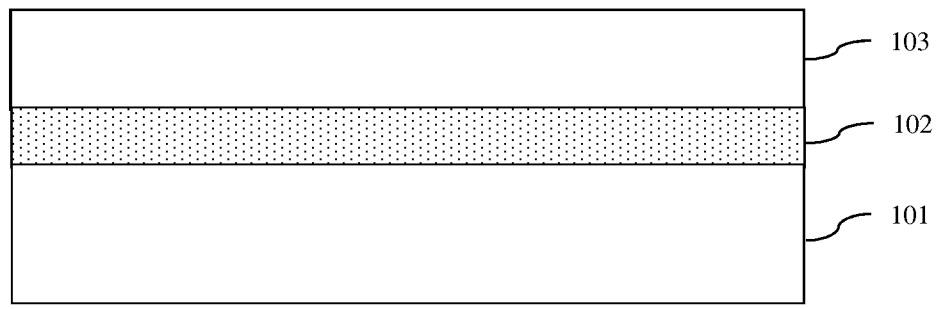
FIG. 13 is a cross-section diagram of a partially completed LEDMOSFET formed according to the method of FIG. 11.

Specifically, a semiconductor layer 103, having a first conductivity type, can be provided (306, see FIG. 13). This semiconductor layer 103 can, for example, comprise a semiconductor layer of a semiconductor-on-insulator (SOI) wafer. Such an SOI wafer can comprise a semiconductor substrate 101 (e.g., a silicon substrate or other semiconductor substrate), an insulator layer 102 (e.g., a silicon oxide layer or other suitable insulator layer) on the substrate 101 and a semiconductor layer 103 (e.g., a single crystalline silicon layer, a single crystalline gallium nitride layer or other suitable semiconductor layer) on the insulator layer 102. Alternatively, the semiconductor layer can comprise the upper portion of a bulk semiconductor wafer (e.g., a single crystalline silicon wafer) or any other suitable wafer (e.g., a hybrid orientation (HOT) wafer) (not shown).

Figure 14A:
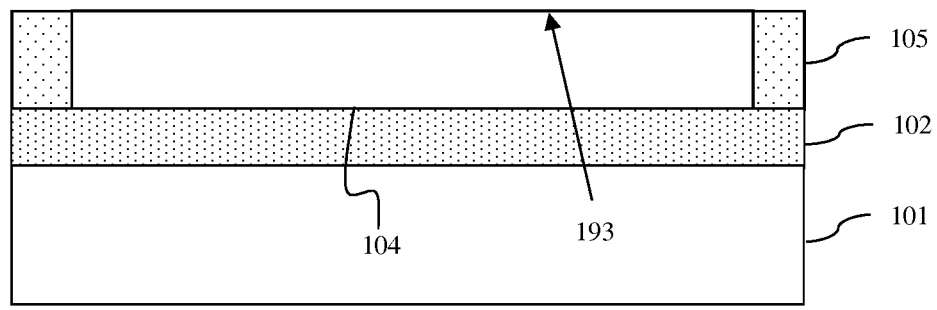
FIG. 14A is a cross-section diagram of a partially completed LEDMOSFET formed according to the method of FIG. 11.
Figure 14B:
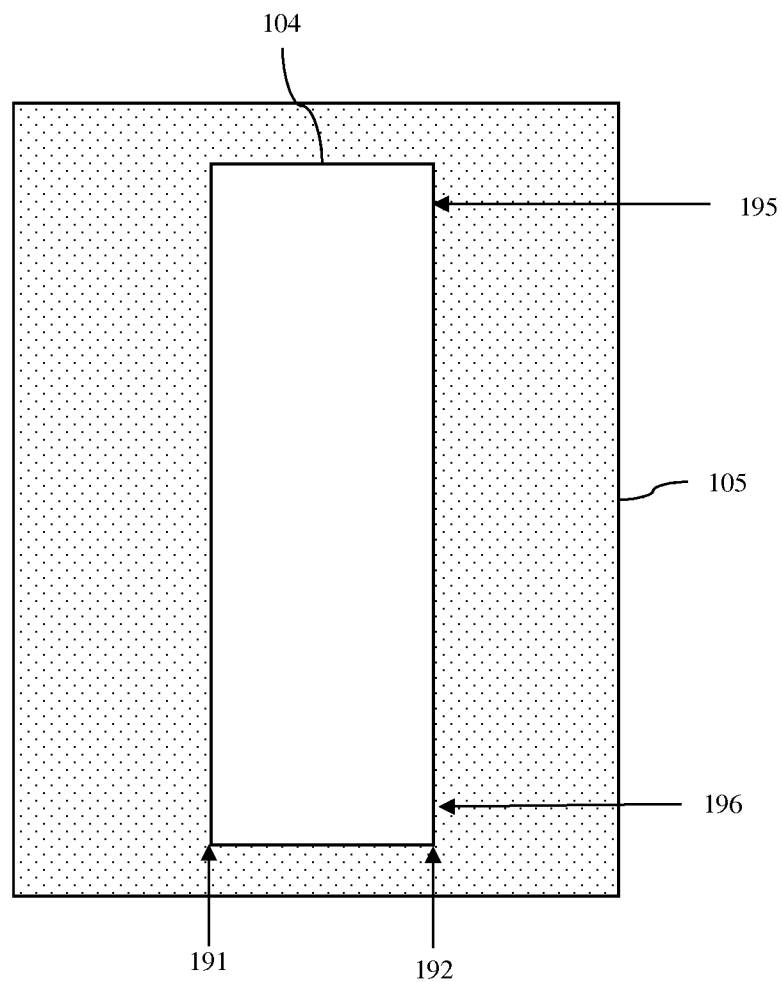
FIG. 14B is a different cross-section diagram of the same partially completed LEDMOSFET as shown in FIG. 14A.

Next, an isolation region 105 can be formed in the semiconductor layer 103 so as to form a semiconductor body 104 laterally surrounded by the isolation region 105 (308, see FIGS. 14A and 14B). Specifically, a trench isolation structure 105 can be formed that extends vertically through the semiconductor layer 103 (e.g., to the insulator layer 102, in the case of an SOI wafer) in order to define the shape of the semiconductor body 104 (i.e., to define the shape of the active region of the LEDMOSFET 100.1 or 100.2) and electrically isolate the semiconductor body 104 from other active regions on the wafer. The trench isolation structure 105 can be formed, for example, using conventional shallow trench isolation (STI) formation techniques. That is, a trench can be formed (e.g., using lithographic patterning techniques) and, then, filled with one or more isolation materials (e.g., a silicon oxide, silicon nitride, silicon oxynitride, etc.). The shape of the semiconductor body 104, as defined by the trench isolation structure 105, can be essentially rectangular. The resulting semiconductor body 104 can have a top surface 193, a first side 191, a second side 192 opposite the first side 191 and opposing ends 195, 196.

The design for the LEDMOSFET can designate various areas of this semiconductor body 104 for subsequent formation (e.g., by doping) of different components of the LEDMOSFET as well the dimensions, conductivity type, doping profiles, etc. for those components. For example, by design, this semiconductor body 104 can have a designated source region 110 at the end 195, an optional designated halo region 120 positioned laterally adjacent to the designate source region 110, a designated channel region 130 positioned laterally adjacent to the designated halo region 120, a designated drain drift region 140 positioned laterally adjacent to the designated channel region 130 and a designated drain region 150 at end 196 positioned laterally adjacent to the drain drift region 140.

After the isolation region 105 is formed at process 308, a gate structure 160 can be formed (see step 310 for a non-planar, multi-gate, LEDMOSFET 100.1 and step 312 for a planar LEDMOSFET 100.2).

For a non-planar, multi-gate, LEDMOSFET 100.1, a gate structure 160 can be formed at process 310 with a main portion 170 and with extensions 180, as defined at process 304 and illustrated in FIGS. 1-4 (310). Specifically, the gate structure 160 can be formed such that it has a main portion 170 adjacent to the designated channel region 130. The main portion 170 can have a horizontal section 171 positioned on the top surface 193 of the semiconductor body 104 and vertical sections 172 positioned on the first and second sides 191, 192 of the semiconductor body 104, as shown in FIG. 3. The gate structure 160 can further be formed such that it has extensions 180 positioned adjacent to the designated drain drift region 140. Each extension 180 can extend vertically through the isolation region 105 and can further extend laterally from the main portion 170 of the gate structure 160 at the channel region towards the designated drain region 150 without extending past the junction 151 between the designated drain drift region 140 and the designated drain region 150. Additionally, each extension 180 can have a sidewall 185 (e.g., a linear sidewall) that is angled relative to the semiconductor body 104 such that a portion 107 of the isolation region 105 between the extension 180 and the semiconductor body 104 has the dimensions defined at process 304 and, particularly, has a continuously increasing width 108 (e.g., a linearly increasing width) along the length 144 of the designated drain drift region 140 from the designated channel region 130 to the designated drain region 150. In other words, the each extension 180 of the gate structure is formed such that a portion 107 of the isolation region 105, which remains between the extension 180 and the designated drain drift region 140 and which will function as a dielectric field plate, is tapered along the length 144 of the designated drain drift region 140 from the designated drain region 150 to the designated channel region 130 and has the specific dimensions defined at process 304.

Figure 15:
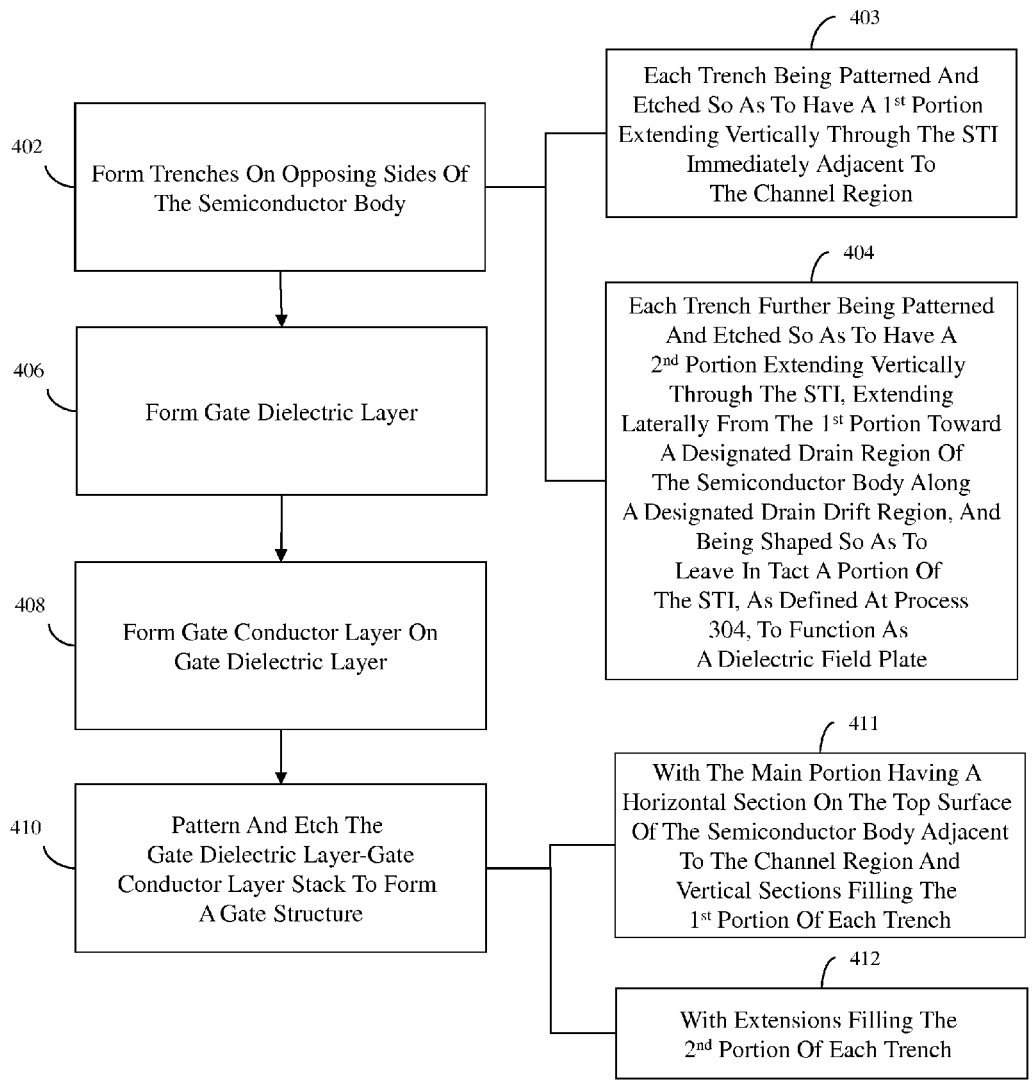
FIG. 15 is a flow diagram illustrating an exemplary technique for forming a gate structure at step 310 of FIG. 11.
Figure 16:
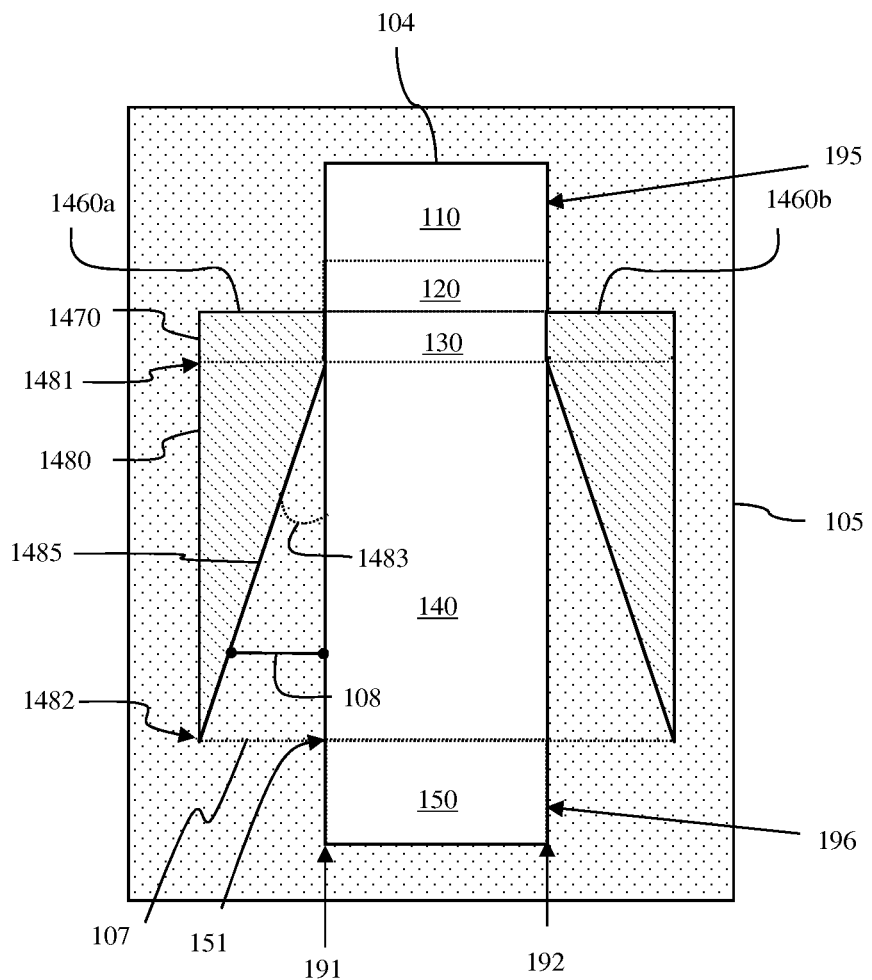
FIG. 16 is a cross-section diagram of a partially completed LEDMOSFET formed according to the technique set forth in FIG. 15.

Referring to FIG. 15, to form such a gate structure 160 for a non-planar, multi-gate, LEDMOSFET 100.1 at process 310 essentially symmetric trenches 1460a-b can be formed on the opposing sides 191 and 192 of the semiconductor body 104 (e.g., using conventional lithographic patterning and etch techniques) (402, see FIG. 16). Each trench 1460a-b can be patterned and etched so as to have a first portion 1470 extending vertically through the trench isolation region 105 (e.g., to the insulator layer 102, in the case of an SOI wafer) (403). This first portion 1470 of each trench 1460a-b can be immediately adjacent to the designated channel region 130 such that the sides 191 and 192 of the semiconductor body 104 at the designated channel region 130 are exposed. Each trench 1460a-b can also be patterned and etched so as to have a second portion 1480 extending vertically through the trench isolation region 105 and extending laterally from the first portion 1470 toward the designated drain region 150 along the designated drain drift region 140 without extending past the junction 151 between the designated drain drift region 140 and the designated drain region 150 (404). Additionally, this second portion 1480 of each trench 1460a-b can be shaped (i.e., tapered) such that the distance between the trench and the designated drain drift region 140 increases from one end 1481 of the second portion 1480 adjacent to the $1^{st}$ portion 1470 of the trench to another end 1482 of the second portion adjacent to the junction 151 between the designated drain drift region 140 and the designated drain region 150 (404). For example, the second portion 1480 of each trench 1460a-b can be shaped so as to have a linear sidewall 1485, which extends from one end 1481 to the other end 1482 and which is angled (i.e., see angel 1483) relative to the semiconductor body 104 so that the distance between the extension and the designated drain drift region 140 increasing linearly. Thus, each trench 1460a-b leaves in tact a portion 107 of the isolation region 105, which is between the second portion 1480 and the semiconductor body 104 and which has the dimensions defined at processes 304 and, particularly, a continuously increasing width 108 (e.g., a linearly increasing width). Next, a conformal gate dielectric layer (e.g., a gate oxide layer, a high-k gate dielectric layer or other suitable gate dielectric layer) can be formed (e.g., deposited) so as to line the trenches 1460a-b and cover the top surface 193 of the semiconductor body 104 (406). After the gate dielectric layer is formed at process 406, a gate conductor layer (e.g., a metal gate conductor layer, a polysilicon gate conductor layer, a dual work function gate conductor layer or other suitable gate conductor layer) can be formed on the gate dielectric layer (408). The gate dielectric-gate conductor gate stack can then be lithographically patterned and etched to form the gate structure 160 with the main portion 170 and extensions 180, as described above (410, see FIGS. 1-4).

Figure 17:
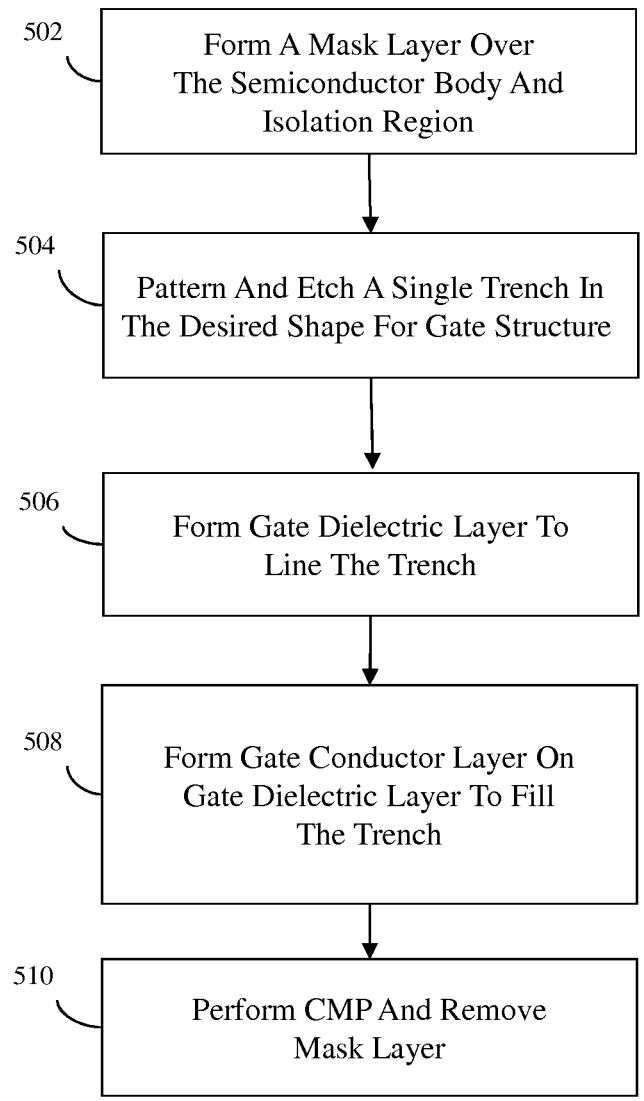
FIG. 17 is a flow diagram illustrating an alternative technique for forming a gate structure at step 310 of FIG. 11.

Those skilled in the art will recognize that other techniques could alternatively be used to form the gate structure 160 at process 310. For example, referring to FIG. 17, a mask layer can be formed over the semiconductor body and over the isolation region that surround the semiconductor body (502). Then, conventional lithographic patterning and etch techniques can be used to form a single trench such that the trench has a first tier that stops on the semiconductor body and a second tier that extends through the isolation region on both sides of the semiconductor body (e.g., to the insulator layer in the case of a SOI wafer). This trench can be patterned and etched so that it has the desired shape of the gate structure, including the main body and extensions, as defined at process 304 (504). Once this trench is etched, a conformal gate dielectric layer (e.g., a gate oxide layer, a high-k gate dielectric layer or other suitable gate dielectric layer) can be formed (e.g., deposited) so as to line the trench (506). After the gate dielectric layer is formed at process 506, a gate conductor layer (e.g., a metal gate conductor layer, a polysilicon gate conductor layer, a dual work function gate conductor layer or other suitable gate conductor layer) can be formed (e.g., deposited) on the gate dielectric layer so as to fill the trench (508). Finally, a chemical mechanical polishing (CMP) process can be formed to expose the mask layer and the mask layer can be removed (510, see FIGS. 1-4).

Referring again to the flow diagram of FIG. 11, for a planar LEDMOSFET 100.2, a gate structure 160 can similarly be formed with a main portion 170 and with extensions 180, as defined at process 304 and illustrated in FIGS. 1-2 and 5-6 (312). Specifically, the gate structure 160 can be formed at process 312 such that it has a main portion 170 adjacent to the designated channel region 130 on the top surface 193 only of the semiconductor body 104. The gate structure 160 can further be formed such that it has extensions 180 positioned adjacent to the designated drain drift region 140. The extensions 180 can be adjacent to the designated drain drift region 140 on both the first and second sides 191-192 of the semiconductor body 104. Each extension 180 can be positioned above (i.e., can sit atop) the isolation region 105 and can extend laterally from the main portion 170 of the gate structure 160 at the designated channel region towards the designated drain region 150 without extending past the junction 151 between the designated drain drift region 140 and the designated drain region 150. Additionally, each extension 180 can have a sidewall 185 (e.g., a linear sidewall) that is angled relative to the semiconductor body 104 such that a portion 107 of the isolation region 105 between the extension 180 and the semiconductor body 104 has the dimensions defined at process 304 and, particularly, has a continuously increasing width 108 (e.g., a linearly increasing width) along the length 144 of the designated drain drift region 140 from the designated channel region 130 to the designated drain region 150. In other words, the each extension 180 of the gate structure is formed such that a portion 107 of the isolation region 105, which remains between the extension 180 and the designated drain drift region 140 and which will function as a dielectric field plate, is tapered along the length 144 of the designated drain drift region 140 from the designated drain region 150 to the designated channel region 130 and has the specific dimensions defined at process 304.

Figure 18:
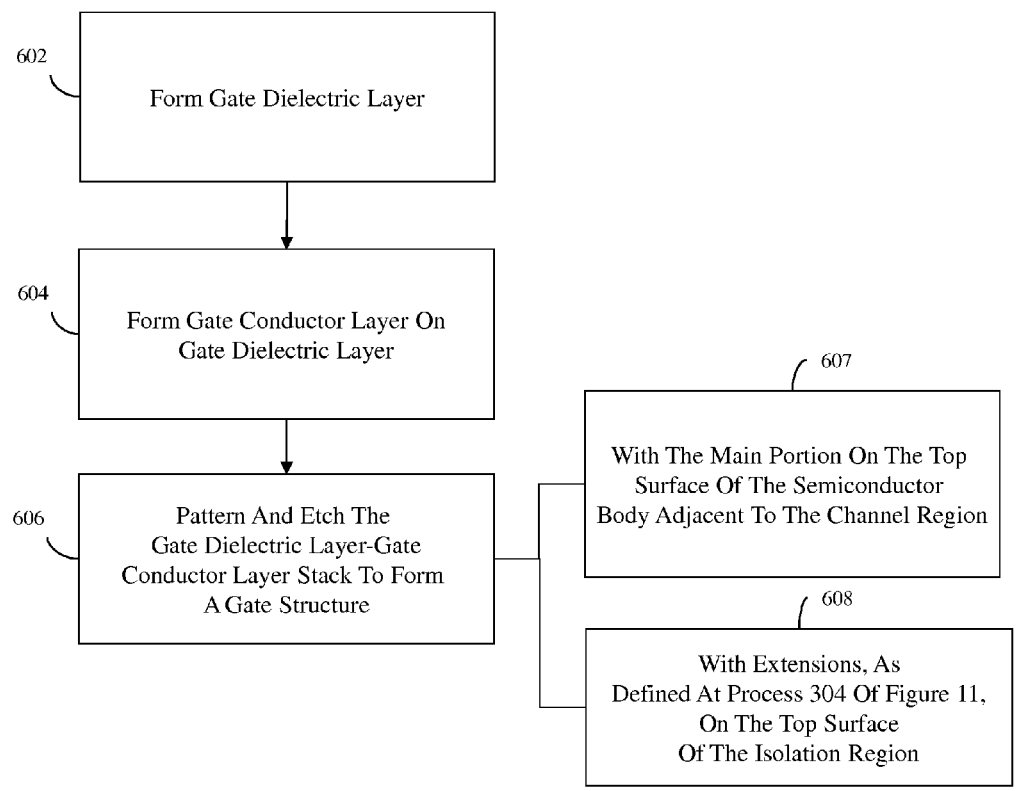
FIG. 18 is a flow diagram illustrating an exemplary technique for forming a gate structure at step 312 of FIG. 11.

Referring to FIG. 18, to form such a gate structure 160 for a planar LEDMOSFET at process 312, a gate dielectric layer (e.g., a gate oxide layer, a high-k gate dielectric layer or other suitable gate dielectric layer) can be formed (e.g., deposited) so as to cover the semiconductor body 104 and the isolation region 105 (602). After the gate dielectric layer is formed at process 602, a gate conductor layer (e.g., a metal gate conductor layer, a polysilicon gate conductor layer, a dual work function gate conductor layer or other suitable gate conductor layer) can be formed on the gate dielectric layer (604). The gate dielectric-gate conductor gate stack can then be lithographically patterned and etched to form the gate structure 160 with the main portion 170 and with the extensions 180 such that a portion 107 of the isolation region 105, as defined at process 304 and described above, remains between the extension 180 and the designated drain drift region 140 to function as a dielectric field plate (606-608, see FIGS. 1-2 and FIGS. 5-6).

The above described techniques for forming the gate structure 160 for a non-planar multi-gate LEDMOSFET 100.1 at process 310 or for a planar LEDMOSFET 100.2 at process 312 are offered for illustration purposes. It should be understood that any other suitable techniques for forming such gate structures could alternatively be used.

Referring again to the flow diagram of FIG. 11, after the gate structure 160 is formed at process 310 or 312, additional processing steps can be performed in order to complete the LEDMOSFET 100.1 or 100.2, as appropriate (314). These additional steps can include, but are not limited to, gate sidewall spacer formation; multiple dopant implantation processes to form the source halo region 120, the drain drift region 140, and the source and drain regions 110, 150; silicide formation; interlayer dielectric deposition; contact formation, etc. Such additional process steps are well-known in the art. Thus, the details of these process steps are omitted form this specification in order to allow the reader to focus on the salient aspects of the invention. Additionally, those skilled in the art will recognize that similar method steps to those described above for forming the LEDMOSFET 100.1 can also be used to form the LEDMOSFET 200 of FIGS. 7-10.

The method as described above can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Also disclosed herein are embodiments of program storage devices (i.e., computer program products) associated with each of the above-described method embodiments and, particularly, process steps 302 and 304 of FIG. 11. The program storage devices can be readable by a computer and can tangibly embody a program of instructions executable by that computer to perform a method of designing any of the LEDMOSFETs, as described above.

Specifically, as will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable program storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable program storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable program storage medium may be any tangible medium (i.e., any non-transitory program storage device) that can contain or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing. Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described above with reference to flowchart illustrations and/or block diagrams of methods, apparatus (systems) and computer program products according to embodiments of the invention. It will be understood that steps 302 and 304 of the flowchart in FIG. 11 can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks. The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

Figure 19:
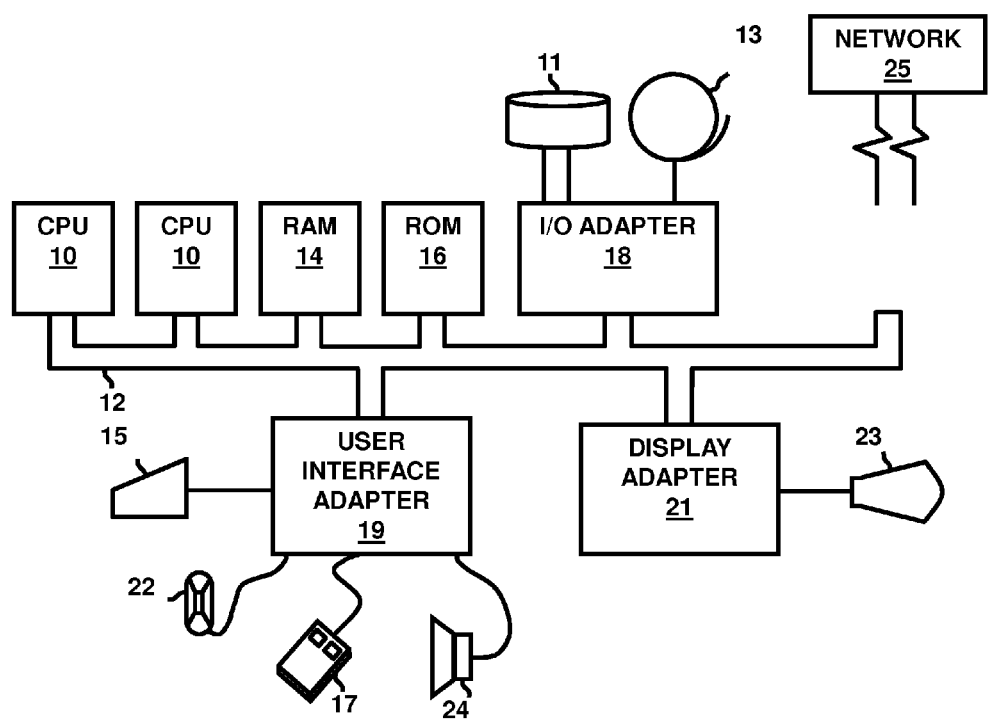
FIG. 19 is a schematic diagram illustrating an exemplary hardware environment that can be used to implement the method embodiments.

A representative hardware environment for practicing the embodiments of the invention and, particularly, steps 302-304 of FIG. 11 is depicted in FIG. 19. This schematic drawing illustrates a hardware configuration of an information handling/computer system in accordance with the embodiments of the invention. The system comprises at least one processor or central processing unit (CPU) 10. The CPUs 10 are interconnected via system bus 12 to various devices such as a random access memory (RAM) 14, read-only memory (ROM) 16, and an input/output (I/O) adapter 18. The I/O adapter 18 can connect to peripheral devices, such as disk units 11 and tape drives 13, or other program storage devices that are readable by the system. The system can read the inventive instructions on the program storage devices and follow these instructions to execute the methodology of the embodiments of the invention. The system further includes a user interface adapter 19 that connects a keyboard 15, mouse 17, speaker 24, microphone 22, and/or other user interface devices such as a touch screen device (not shown) to the bus 12 to gather user input. Additionally, a communication adapter 20 connects the bus 12 to a data processing network 25, and a display adapter 21 connects the bus 12 to a display device 23 which may be embodied as an output device such as a monitor, printer, or transmitter, for example.

The flowchart and block diagrams in the Figures illustrate the architecture, functionality, and operation of possible implementations of the methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

It should be understood that the terminology used herein is for the purpose of describing particular embodiments only and is not intended to be limiting of the invention. As used herein, the singular forms "a", "an" and "the" are intended to include the plural forms as well, unless the context clearly indicates otherwise. It should further be understood that the terms "comprises", "comprising", "includes", and/or "including", when used in this specification, specify the presence of stated features, integers, steps, operations, elements, and/or components, but do not preclude the presence or addition of one or more other features, integers, steps, operations, elements, components, and/or groups thereof. Additionally, it should be understood that the corresponding structures, materials, acts, and equivalents of all means or step plus function elements in the claims below are intended to include any structure, material, or act for performing the function in combination with other claimed elements as specifically claimed. The description of the embodiments of the present invention has been presented for purposes of illustration and description, but is not intended to be exhaustive or limited to the invention in the form disclosed. Many modifications and variations to the embodiments will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

Therefore, disclosed above are embodiments of a lateral, extended drain, metal oxide semiconductor, field effect transistor (LEDMOSFET) having a relatively high drain-to-body breakdown voltage (Vb). The LEDMOSFET embodiments have gate structure extensions that are positioned adjacent to opposing sides of the drain drift region and function as conductive field plates. In one embodiment, these extensions extend vertically through the isolation region that surrounds the LEDMOSFET. In another embodiment, the extensions sit atop the isolation region. In either case, each extension has a sidewall that is angled relative to the drain drift region such that the portion of the isolation region between the extension and the drain drift region (i.e., the portion of the isolation region that functions as a dielectric field plate) has a continuously increasing width along the length of the drain drift region from the channel region to the drain region. This dielectric field plate, which is tapered from the drain region to the channel region, creates a strong essentially uniform horizontal electric field profile within the drain drift. Such an electric field profile limits the transverse field to the nwell/pwell junction, limits the ionization rate to safe, low values and allows the drain drift region to be efficiently depleted so that a relatively high specific drain-to-body breakdown voltage to be achieved. Also disclosed are embodiments of an associated method for forming the LEDMOSFET with a specific Vb by defining the dimensions of the extensions and a program storage device for designing the LEDMOSFET to have such a specific Vb.

What is claimed is:

1. A field effect transistor comprising:
   a semiconductor body having a first side and a second side opposite said first side, said semiconductor body comprising:
   a channel region;
   a drain drift region positioned laterally adjacent to said channel region; and
   a drain region positioned laterally adjacent to said drain drift region opposite said channel region;
   an isolation region positioned laterally immediately adjacent to said channel region, said drain drift region, and at least three sides of said drain region within said semiconductor body; and
   a gate structure comprising extensions adjacent to said drain drift region on said first side and said second side, each extension being above said isolation region and extending laterally from said channel region toward said drain region, and
   each extension further having a sidewall that is angled relative to said semiconductor body such that a portion of said isolation region between said extension and said semiconductor body has a continuously increasing width along a length of said drain drift region from said channel region to said drain region.

2. The field effect transistor of claim 1, said sidewall being linear such that said portion of said isolation region between said extension and said semiconductor body has a linearly increasing width.

3. The field effect transistor of claim 1, further comprising:
a substrate; and
an insulator layer on said substrate, said semiconductor body and said isolation region being on said insulator layer and said semiconductor body comprising any one of silicon and gallium nitride.

4. The field effect transistor of claim 1, said field effect transistor having an essentially uniform horizontal electric field profile within said drain drift region from said channel region to said drain region.

5. The field effect transistor of claim 1, said portion of said isolation region between said extension and said semiconductor body having predefined dimensions so that said field effect transistor has a specific drain-to-body breakdown voltage.

6. A method of forming a field effect transistor, said method comprising:
forming an isolation region in a semiconductor layer so as to form a designated channel region, a designated drain drift region, and a designated drain region of a semiconductor body laterally surrounded by said isolation region, said semiconductor body having a first side and a second side opposite said first side,
wherein said isolation region is positioned laterally immediately adjacent to said designated channel region, said designated drain drift region, and at least three sides of said designated drain region within said semiconductor body; and
forming a gate structure such that said gate structure comprises extension adjacent to said designated drain drift region in said semiconductor body,
said designated drain drift region being positioned laterally between said designated channel region and said designated drain region in said semiconductor body,
said extensions being on said first side and said second side,
each extension being above said isolation region,
each extension extending laterally from said designated channel region toward said designated drain region, and
each extension further having a sidewall that is angled relative to said semiconductor body such that a portion of said isolation region between said extension and said semiconductor body has a continuously increasing width along a length of said designated drain drift region from said designated channel region to said designated drain region.

7. The method of claim 6, said forming of said gate structure comprising forming said gate structure such that said sidewall is linear and said portion of said isolation region between said extension and said semiconductor body has a linearly increasing width.

8. The method of claim 6, further comprising: providing a semiconductor-on-insulator wafer comprising a substrate, an insulator layer on said substrate and said semiconductor layer on said insulator layer, said semiconductor layer comprising any one of silicon and gallium nitride and said forming of said gate structure comprising forming said gate structure such that said extensions extend vertically through said isolation region to said insulator layer.

9. The method of claim 6, further comprising, prior to said forming said gate structure, defining dimensions of said portion of said isolation region between said extension and semiconductor body, said defining being based at least on a specified width, a specified length and a specified doping profile for a drain drift region so that field effect transistor will have an essentially uniform horizontal electric field profile within said drain drift region and a specific drain-to-body breakdown voltage.

10. A non-transitory program storage device readable by a computer and tangibly embodying a program of instructions executable by said computer to perform a method of designing a field effect transistor, said method comprising:
accessing a design for said field effect transistor, said field effect transistor comprising:
a semiconductor body having a first side and a second side opposite said first side, said semiconductor body comprising:
a channel region;
a drain drift region positioned laterally adjacent to said channel region; and
a drain region positioned laterally adjacent to said drain drift region opposite said channel region;
an isolation region positioned laterally immediately adjacent to said drain drift region and at least three sides of said drain region within said semiconductor body and
a gate structure adjacent to said channel region; and
incorporating gate structure extensions into said design,
said extensions being adjacent to said drain drift region on said first side and said second side,
each extension extending vertically through said isolation region and extending laterally from said channel region toward said drain region, and
each extension further having a sidewall that is angled relative to said semiconductor body such that a portion of said isolation region between said extension and said semiconductor body has a continuously increasing width along a length of said drain drift region from said channel region to said drain region,
said incorporating comprising defining the dimensions of said portion of said isolation region between said extension and said semiconductor body based at least on a specified width, a specified length and a specified doping profile for said drain drift region so that said field effect transistor will have an essentially uniform horizontal electric field profile within said drain drift region and a specific drain-to-body breakdown voltage.

11. The non-transitory program storage device of claim 10, said design comprising a high-level description of said field effect transistor.

12. The non-transitory program storage device of claim 10, said defining of said dimensions of said portion of said isolation region comprising defining an angle at which said sidewall will be positioned relative to said semiconductor body.

13. The non-transitory program storage device of claim 10, said defining of said dimensions of said portion of said isolation region comprising defining a maximum length of said portion of said isolation region.

14. The non-transitory program storage device of claim 10, said defining of said dimensions of said portion of said isolation region comprising defining a maximum width of said portion of said isolation region.

15. The non-transitory program storage device of claim 10, said sidewall being linear such that said portion of said isolation region has a linearly increasing width.

16. A non-transitory program storage device readable by a computer and tangibly embodying a program of instructions executable by said computer to perform a method of designing a field effect transistor, said method comprising:
 accessing a design for a field effect transistor, said field effect transistor comprising:
  a semiconductor body having a first side and a second side opposite said first side, said semiconductor body comprising:
   a channel region;
   a drain drift region positioned laterally adjacent to said channel region;
   a drain region positioned laterally adjacent to said drain drift region opposite said channel region;
   an isolation region positioned laterally immediately adjacent to said channel region, said drain drift region, and at least three sides of said drain region within said semiconductor body and
   a gate structure adjacent to said channel region; and
 incorporating gate structure extensions into said design,
  said extensions being adjacent to said drain drift region on said first side and said second side,
  each extension being above said isolation region,
  each extension extending laterally from said channel region toward said drain region, and
  each extension further having a sidewall that is angled relative to said semiconductor body such that a portion of said isolation region between said extension and said semiconductor body has a continuously increasing width along a length of said drain drift region from said channel region to said drain region,
 said incorporating comprising defining dimensions of said portion of said isolation region between said extension and said semiconductor body based at least on a specified width, a specified length and a specified doping profile for said drain drift region so that said field effect transistor will have an essentially uniform horizontal electric field profile within said drain drift region and a specific drain-to-body breakdown voltage.

17. The non-transitory program storage device of claim 16, said design comprising a high-level description of said field effect transistor.

18. The non-transitory program storage device of claim 16, said defining of said dimensions of said portion of said isolation region comprising defining an angle at which said sidewall will be positioned relative to said semiconductor body.

19. The non-transitory program storage device of claim 16, said defining of said dimensions of said portion of said isolation region comprising defining a maximum length of said portion of said isolation region.

20. The non-transitory program storage device of claim 16, said defining of said dimensions of said portion of said isolation region comprising defining a maximum width of said portion of said isolation region.

* * * * *